US011831297B2

(12) United States Patent
Kawai et al.

(10) Patent No.: US 11,831,297 B2
(45) Date of Patent: Nov. 28, 2023

(54) RESONATOR AND RESONANCE DEVICE WITH OPENING GROOVES HAVING DIFFERENT WIDTHS

(71) Applicant: Murata Manufacturing Co., Ltd., Nagaokakyo (JP)

(72) Inventors: Ryota Kawai, Nagaokakyo (JP); Toshio Nishimura, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 641 days.

(21) Appl. No.: 17/038,519

(22) Filed: Sep. 30, 2020

(65) Prior Publication Data

US 2021/0028763 A1    Jan. 28, 2021

Related U.S. Application Data

(63) Continuation of application No. PCT/JP2018/047346, filed on Dec. 21, 2018.

(30) Foreign Application Priority Data

May 2, 2018  (JP) .................. 2018-088840
Aug. 13, 2018  (JP) .................. 2018-152496

(51) Int. Cl.
*H03H 9/24*   (2006.01)
*H10N 30/20*  (2023.01)
(Continued)

(52) U.S. Cl.
CPC ............. *H03H 9/24* (2013.01); *H10N 30/20* (2023.02); *H10N 30/50* (2023.02); *H10N 30/87* (2023.02)

(58) Field of Classification Search
CPC .. H03H 9/24; H03H 9/02433; H03H 9/02448; H03H 9/02157; H03H 9/1057;
(Continued)

(56) References Cited

U.S. PATENT DOCUMENTS

| 2012/0229226 | A1  | 9/2012 | Oja et al. |
| 2019/0109578 | A1  | 4/2019 | Goto et al. |
| 2020/0259476 | A1* | 8/2020 | Hirota ................. H03H 9/2484 |

FOREIGN PATENT DOCUMENTS

| JP | H0888538 A  | 4/1996 |
| JP | H08186467 A | 7/1996 |

(Continued)

OTHER PUBLICATIONS

International Search Report issued for PCT/JP2018/047346, dated Mar. 19, 2019.
(Continued)

*Primary Examiner* — Emily P Pham
(74) *Attorney, Agent, or Firm* — ArentFox Schiff LLP

(57) ABSTRACT

A resonator includes a vibration portion that has a substrate having a main surface, a lower electrode on the main surface of the substrate, a piezoelectric film on the lower electrode, and an upper electrode on the piezoelectric film. A frame surrounds at least part of the vibration portion. Opening grooves having different widths in a first direction in a plan view of the main surface are provided in a periphery of the vibration portion. In a plan view of the main surface, the upper electrode is provided so as to be spaced from an outer edge of the substrate by a gap which is along the first direction, such that a length of the gap in a region where a width of the opening groove is large is larger than a length of the gap in a region where a width of the opening groove is small.

20 Claims, 17 Drawing Sheets

(51) Int. Cl.
*H10N 30/50* (2023.01)
*H10N 30/87* (2023.01)

(58) Field of Classification Search
CPC .... H03H 9/2489; H03H 3/0072; H10N 30/20; H10N 30/50; H10N 30/87
See application file for complete search history.

(56) References Cited

FOREIGN PATENT DOCUMENTS

| | | |
|---|---|---|
| JP | 2013506334 A | 2/2013 |
| JP | 5552878 B2 | 7/2014 |
| WO | 2018008480 A1 | 1/2018 |

OTHER PUBLICATIONS

Written Opinion of the International Searching Authority issued for PCT/JP2018/047346, dated Mar. 19, 2019.

* cited by examiner

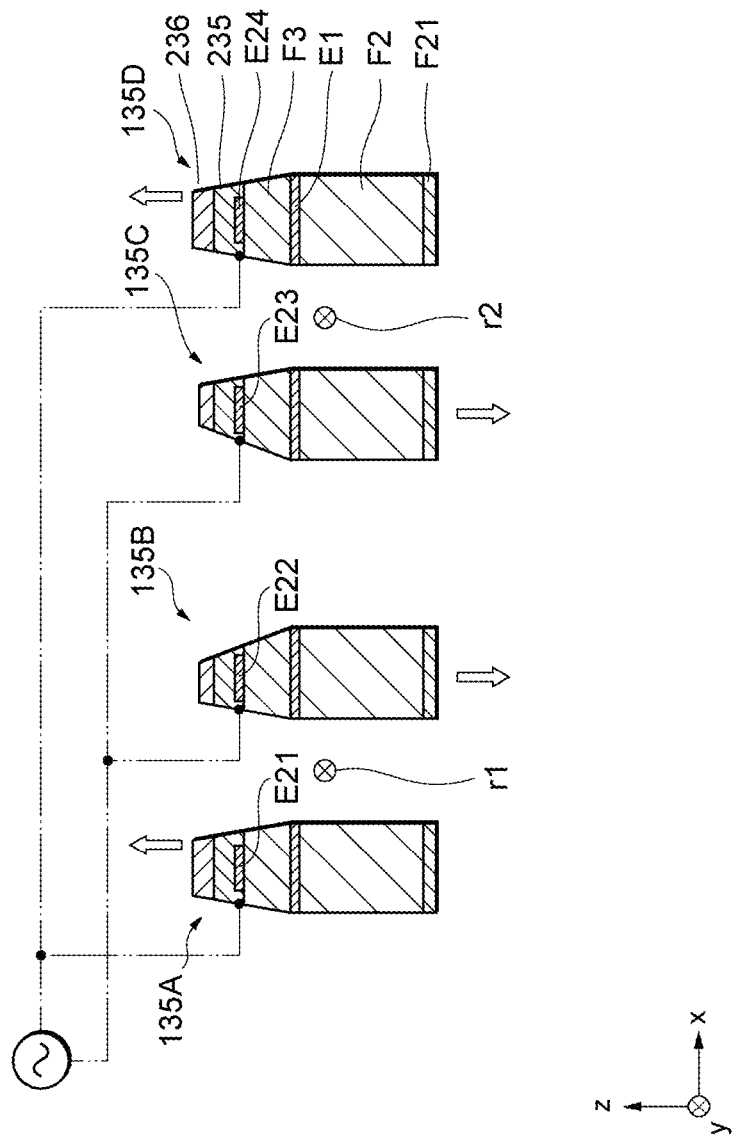

FIG. 14
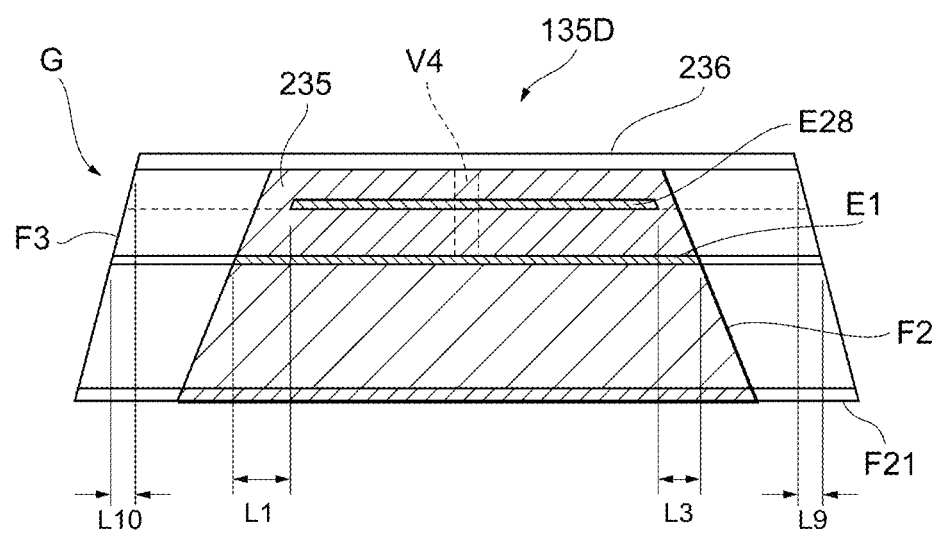
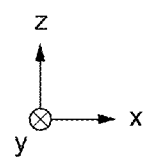

RESONATOR AND RESONANCE DEVICE WITH OPENING GROOVES HAVING DIFFERENT WIDTHS

CROSS REFERENCE TO RELATED APPLICATIONS

The present application is a continuation of PCT/JP2018/047346, filed Dec. 21, 2018, which claims priority to Japanese Patent Application No. 2018-152496, filed Aug. 13, 2018, and to Japanese Patent Application No. 2018-088840, filed May 2, 2018, the entire contents of each of which are incorporated herein by reference.

TECHNICAL FIELD

The present invention relates to a resonator and a resonance device.

BACKGROUND

A resonator such as a piezoelectric vibrator can be used as a device for implementing a timer function in electronic devices. As electronic devices are made smaller, there is need for resonators to be made smaller as well, and resonators manufactured using MEMS (Micro Electro Mechanical Systems) technology (also called "MEMS vibrators" hereinafter) are garnering attention.

For example, Patent Document 1 (identified below) discloses a resonator having three vibration arms in which a lower electrode, a piezoelectric film, and an upper electrode are formed in this order on an Si (silicon) substrate.

Patent Document 1: Japanese Patent No. 5552878.

In a resonator, when a vibration arm is formed, normally, an electrode and a piezoelectric film are formed on an Si substrate, and then patterning (release) by etching or the like is performed. At this time, the larger a release width (that is, a width of a portion removed by etching) is, the faster an etching rate is. However, the etching rate affects the etching amount not only in the thickness direction but also in the horizontal direction.

In the existing resonator as disclosed in Patent Document 1, a width between an outer edge of the vibration arm and an outer edge of the electrode is constant regardless of the release width. In this case, since the piezoelectric film at a portion with a wide release width is etched more than a portion with a narrow width, there is a risk that the electrodes will be short-circuited to each other.

Furthermore, even when the configuration is such that the upper electrode is covered with a protective film, since the protective film is removed in a large amount at the portion with the wide release width in the same manner, the upper electrode is exposed.

SUMMARY OF THE INVENTION

Accordingly, the exemplary embodiments of the present invention have been made in view of the above-described circumstances. Thus, it is an object of the present invention to prevent a short circuit of an electrode by etching in a resonator.

In an exemplary embodiment, a resonator is provided that includes a vibration portion that has a substrate having a main surface, a lower electrode formed on the main surface of the substrate, a piezoelectric film formed on the lower electrode, and an upper electrode formed on the piezoelectric film. Moreover, a holding portion or frame is provided so as to surround at least part of the vibration portion. Opening grooves having different widths in a first direction in a plan view of the main surface of the substrate are provided in a periphery of the vibration portion. Moreover, in a plan view of the main surface of the substrate, the upper electrode is provided so as to be spaced from an outer edge of the substrate by a gap which is along the first direction, and is formed such that a length of the gap in a region where a width of the opening groove is large is larger than a length of the gap in a region where a width of the opening groove is small.

According to the exemplary embodiments of the present invention, a short circuit of an electrode by etching is prevented in a resonator.

BRIEF DESCRIPTION OF DRAWINGS

FIG. 7 is a cross-sectional view of a plurality of vibration arms, taken along a line DD' in FIG. 4.

FIG. 14 is a cross-sectional view of a vibration arm, taken along a line EE' in FIG. 13.

DETAILED DESCRIPTION OF EMBODIMENTS

First Exemplary Embodiment

Figure 1:
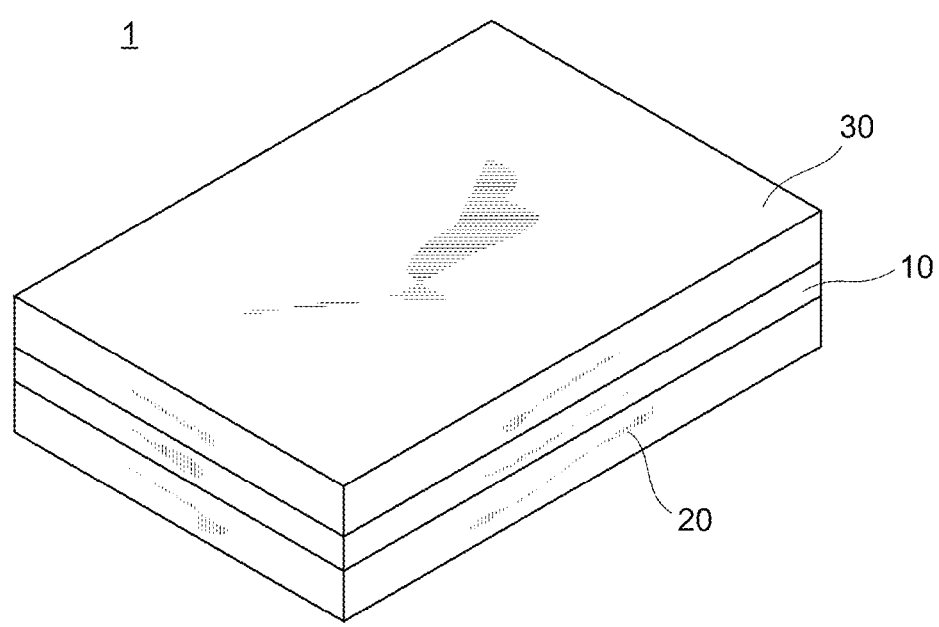
FIG. 1 is a perspective view schematically illustrating the external appearance of a resonance device according to a first exemplary embodiment.
Figure 2:
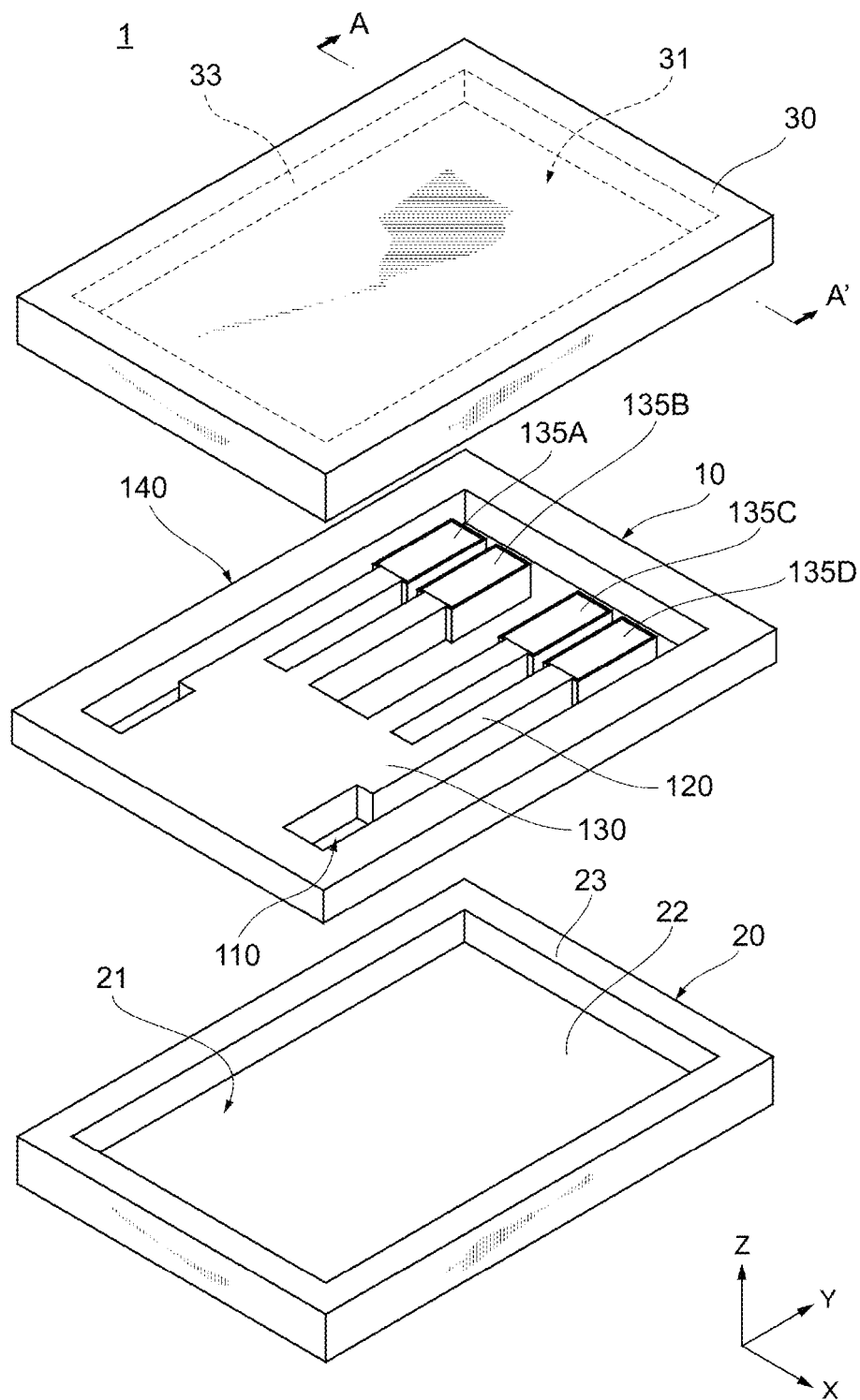
FIG. 2 is an exploded perspective view schematically illustrating the structure of the resonance device according to the first exemplary embodiment.
Figure 3:
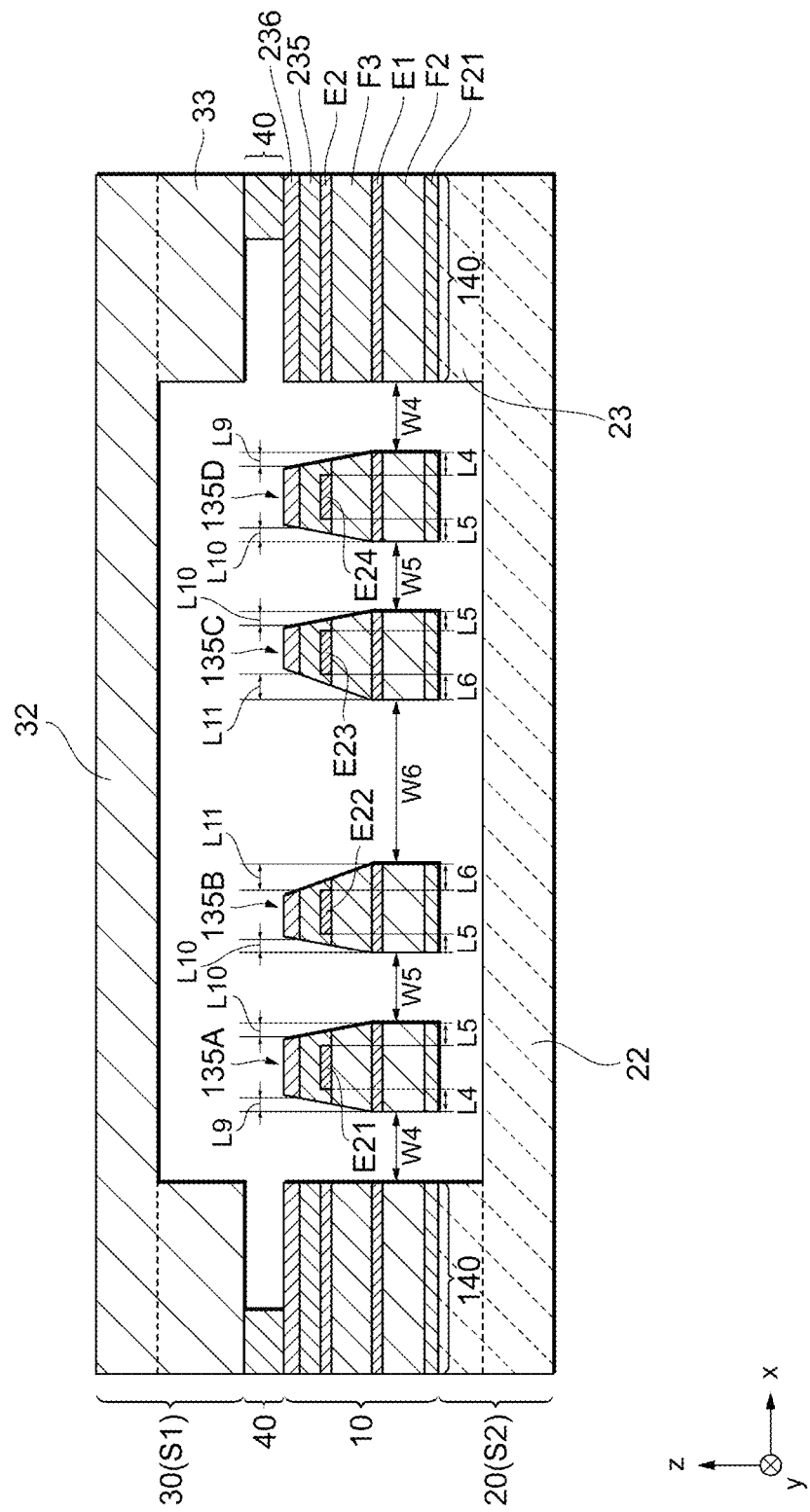
FIG. 3 is a cross-sectional view of the resonance device, taken along a line AA' in FIG. 2.

Hereinafter, a first exemplary embodiment of the present invention will be described with reference to the accompanying drawings. FIG. 1 is a perspective view schematically illustrating the external appearance of a resonance device 1 according to the first embodiment. Furthermore, FIG. 2 is an exploded perspective view schematically illustrating the structure of the resonance device 1 according to the first embodiment. Furthermore, FIG. 3 is a cross-sectional view of the resonance device 1, taken along a line AA' in FIG. 2.

As shown, the resonance device 1 includes a resonator 10, and an upper cover 30 and a lower cover 20 provided so as to face each other with the resonator 10 interposed therebetween. That is, the resonance device 1 is configured by laminating the lower cover 20, the resonator 10, and the upper cover 30 in this order.

Furthermore, the resonator 10 is sealed by bonding between the resonator 10 and the lower cover 20 and bonding between the resonator 10 and the upper cover 30, and a vibration space for the resonator 10 is formed. Each of the resonator 10, the lower cover 20, and the upper cover 30 is formed by using an Si (silicon) substrate, for example. The Si substrates of the resonator 10 and the lower cover 20 are bonded to each other, and the Si substrates of the resonator 10 and the upper cover 30 are bonded to each other. The resonator 10 and the lower cover 20 may each be formed using an SOI substrate. It is noted that the lower cover 20 and the upper cover 30 may be bonded to each other, and the resonator 10 may be housed inside a vibration space formed by the lower cover 20 and the upper cover 30.

According to an exemplary aspect, the resonator 10 is an MEMS resonator manufactured using MEMS technology. Note that the exemplary embodiment describes the resonator 10 that is formed using an Si substrate as an example. In the following description, in the lower cover 20, a surface facing the resonator 10 is taken as a front surface, and a surface facing the front surface is taken as a back surface. Furthermore, in the upper cover 30, a surface facing the resonator 10 is taken as a back surface, and a surface facing the back surface is taken as a front surface. In the resonator 10, a surface facing the lower cover 20 is taken as a back surface, and a surface facing the upper cover 30 is taken as a front surface. In the same manner, a surface of each constituent element of the resonator 10 facing the lower cover 20 is taken as a back surface, and a surface thereof facing the upper cover 30 is taken as a front surface. A direction from the lower cover 20 toward the upper cover 30 is taken as an upper direction, and a direction opposite thereto is taken as a lower direction.

Hereinafter, each configuration of the resonance device 1 will be described in detail.

Upper Cover 30

The upper cover 30 extends in a flat plate shape along an XY plane, and, for example, a recessed portion 31 having a flat rectangular parallelepiped shape is formed on the back surface side thereof. The recessed portion 31 is surrounded by a side wall 33 and a bottom plate 32, and forms part of a vibration space which is a space in which the resonator 10 vibrates.

The upper cover 30 is formed by an Si (silicon) wafer S1 having a predetermined thickness. The upper cover 30 has the bottom plate 32 having a rectangular flat plate shape provided along the XY plane, and the side wall 33 extending from the peripheral edge portion of the bottom plate 32 toward the lower cover 20 (resonator 10). As illustrated in FIG. 3, the upper cover 30 is bonded to a holding portion 140 (e.g., a frame) of the resonator 10 with a bonding layer 40 by the back surface of the side wall 33 thereof. The front surface and the back surface of the upper cover 30 are preferably covered by a silicon oxide film (not illustrated). The silicon oxide film is formed on the front surface of the Si wafer S1 by, for example, oxidation of the front surface of the Si wafer S1 or Chemical Vapor Deposition (CVD).

It is noted that although not illustrated in FIG. 3, a terminal is formed on the front surface of the upper cover 30. The terminal is formed by filling a through-hole formed in the upper cover 30 with a conductive material, such as impurity-doped polycrystalline silicon (Poly-Si), Cu (copper), Au (gold), impurity-doped single crystal silicon, or the like, for example. Moreover, the terminal is connected to a wiring for electrically connecting an external power supply and the resonator 10. The terminal may be formed on the back surface of the lower cover 20, or on the side surface of the upper cover 30 or the lower cover 20.

Lower Cover 20

The lower cover 20 has a bottom plate 22 having a rectangular flat plate shape provided along the XY plane, and a side wall 23 extending from the peripheral edge portion of the bottom plate 22 toward the upper cover 30 (resonator 10). In the lower cover 20, a recessed portion 21 formed by the front surface of the bottom plate 22 and the inner surface of the side wall 23 is provided on the front surface side thereof. The recessed portion 21 forms part of the vibration space of the resonator 10. By the upper cover 30 and the lower cover 20 described above, this vibration space is hermetically sealed, and is maintained in a vacuum state. This vibration space may be filled with, for example, gas such as inert gas or the like.

As illustrated in FIG. 3, the bottom plate 22 and the side wall 23 of the lower cover 20 are integrally formed by an Si (silicon) wafer S2 having a predetermined thickness. Furthermore, the lower cover 20 is bonded to the holding portion 140 of the resonator 10 by the front surface of the side wall 23. The thickness of the lower cover 20 defined in a Z-axis direction is, for example, 150 µm, and the depth of the recessed portion 21 defined in the Z-axis direction is, for example, 50 µm. According to an exemplary aspect, it is noted that the Si wafer S2 is formed of silicon that is not degenerated, and a resistivity thereof is, for example, equal to or higher than 16 mΩ·cm.

Resonator 10

Next, the configuration of the resonator 10 will be described with reference to FIG. 4 in addition to FIGS. 1 to 3.

Figure 4:
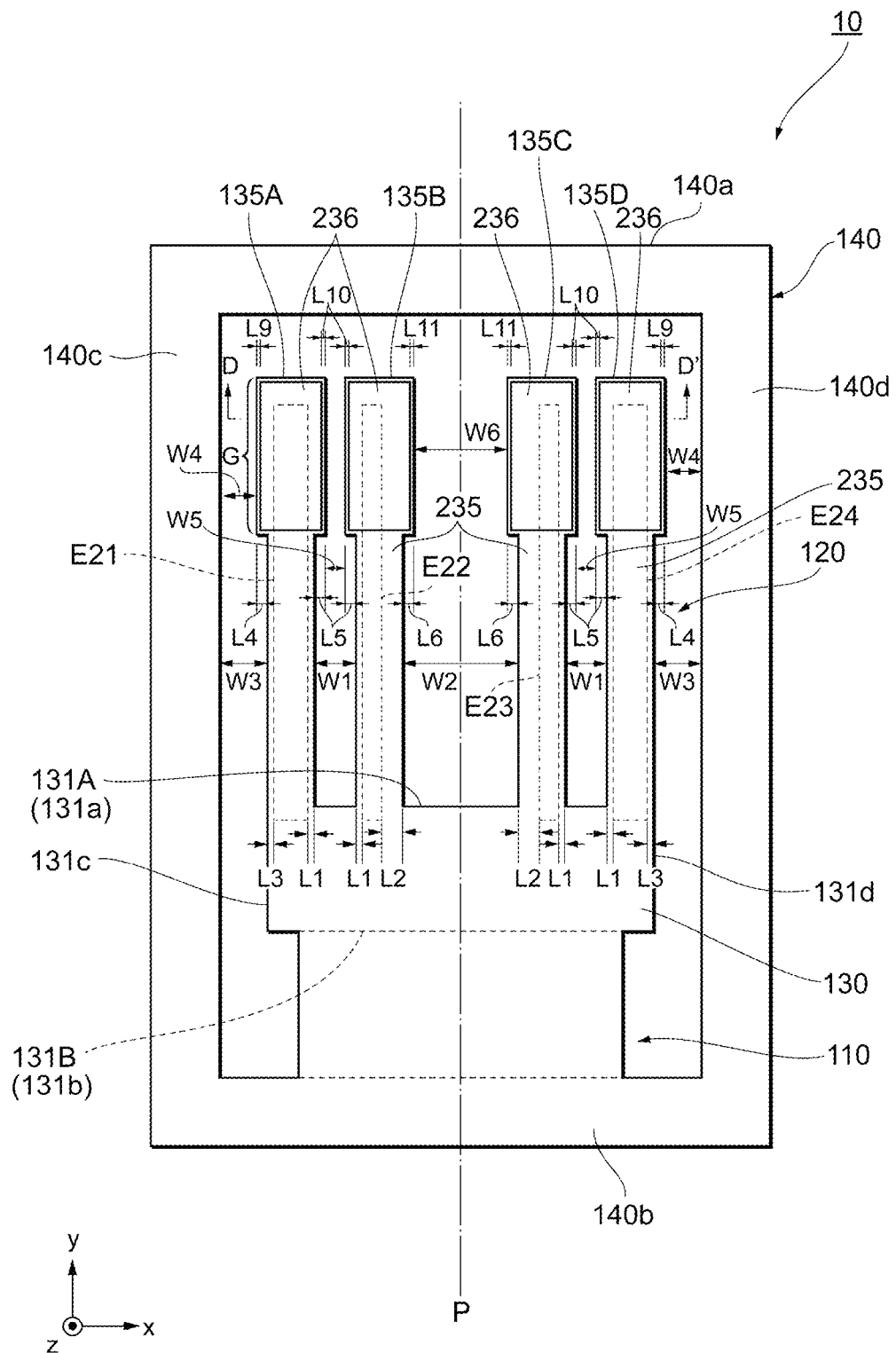
FIG. 4 is a plan view of a resonator according to the first exemplary embodiment, from which an upper cover is removed.

FIG. 4 is a plan view schematically illustrating the structure of the resonator 10 according to the present embodiment. The resonator 10 includes a vibration portion 120, the holding portion 140 (i.e., a frame), and a holding arm 110. The vibration portion 120 has a base or base portion 130, and a plurality of vibration arms 135A to 135D (hereinafter also collectively referred to as a "plurality of vibration arms 135") each of which has a fixed end connected to the base portion 130 and an open end provided away from the base portion 130 and extends from the fixed end to the open end. Furthermore, in the vibration portion 120, metal layers E21 to E24 (hereinafter, the metal layers E21 to E24 are also collectively referred to as a "metal layer E2") are formed. In the following description, the metal layers E21 to E24 formed in the plurality of vibration arms 135 of the metal layer E2 are also particularly referred to as upper electrodes E21 to E24, respectively. Furthermore, in FIG. 4, wirings, terminals, and the like for electrically connecting the upper electrodes E21 to E24 to an external driving power supply are not illustrated.

Lamination Structure

First, referring to FIG. 3, the lamination structure of the resonator 10 will be described. In the resonator 10, the holding portion 140, the base portion 130, the plurality of vibration arms 135, and the holding arm 110 are integrally formed through the same process. In the resonator 10, first, a metal layer E1 (an example of a lower electrode) is laminated on an Si (silicon) substrate F2. Then, on the metal layer E1, a piezoelectric thin film F3 (an example of a piezoelectric film) is laminated so as to cover the metal layer E1, and the metal layers E21 to E24 are further laminated on the front surface of the piezoelectric thin film F3. On the metal layers E21 to E24, a protective film 235 is laminated so as to cover the metal layers E21 to E24. At the tip end or free end (a weight portion G, which will be described later) of each of the plurality of vibration arms 135, a conductive film 236 is further laminated on the protective film 235. In a plan view from the upper cover 30 side as illustrated in FIG. 4, a pair of end portions facing each other in an X-axis direction of the upper electrode E21 provided in the weight portion G are located in an inner side portion of the conductive film 236 of the vibration arm 135A. The same configuration applies to the vibration arms 135B to 135D. In the present exemplary embodiment, the metal layers E21 to E24 extend to the tip or free ends of the plurality of vibration arms 135 (see FIG. 4), respectively, but may be configured so as not to extend to the tip ends. In the case of a configuration in which the metal layer does not extend to the tip end, it is possible to suppress a change in characteristics due to a short circuit with the metal layer E1 or the conductive film 236.

It is noted that using a degenerate silicon substrate having a low resistance as the Si substrate F2 enables the Si substrate F2 itself to also function as the lower electrode, and it is thus also possible to omit the metal layer E1. Furthermore, an arbitrary layer may be formed between the Si substrate F2 and the metal layer E1.

The Si substrate F2 is formed of, for example, a degenerated n-type Si semiconductor having a thickness of approximately 6 μm, and can include P (phosphorus), As (arsenic), Sb (antimony), or the like as an n-type dopant. In particular, it is preferable that a rotation angle formed by the plurality of vibration arms 135 and a [100] crystal axis of the Si substrate F2 formed of the n-type Si semiconductor or a crystal axis equivalent thereto fall within a range of greater than 0 degrees and equal to or smaller than 15 degrees (or a range of equal to or greater than 0 degrees and equal to or smaller than 15 degrees may be used), or a range of equal to or greater than 75 degrees and equal to or smaller than 90 degrees. It is noted that the rotation angle here refers to an angle of a direction in which the holding arm 110 extends with respect to a line segment along the [100] crystal axis of the Si substrate F2 or the crystal axis equivalent thereto.

Furthermore, the resistance value of the degenerate Si used for the Si substrate F2 is, for example, smaller than 1.6 mΩ·cm, and is more preferably equal to or smaller than 1.2 mΩ·cm. Furthermore, a silicon oxide (for example, $SiO_2$) layer F21 corresponding to a temperature characteristics correction layer is formed on the lower surface of the Si substrate F2. This configuration improves the temperature characteristics.

In the present embodiment, the temperature characteristics correction layer refers to a layer having a function of reducing a temperature coefficient (that is, a change rate per temperature) of a frequency in the vibration portion 120 at least in the vicinity of the normal temperature. The vibration portion 120 has the silicon oxide layer F21 corresponding to the temperature characteristics correction layer, whereby it is possible to reduce a change caused in accordance with the temperature, in the resonant frequency of the laminated structure body formed of the Si substrate F2, the metal layers E1 and E2, the piezoelectric thin film F3, and the silicon oxide layer F21, for example.

In the resonator 10, the silicon oxide layer F21 is desirably formed with a uniform thickness. For purposes of this disclosure, it is noted that the uniform thickness means that a variation in thickness of the silicon oxide layer F21 falls within a range of ±20% from the average value of the thickness.

It is also noted that the silicon oxide layer F21 may be formed on the upper surface of the Si substrate F2, or may be formed on both the upper surface and the lower surface of the Si substrate F2. In addition, in the holding portion 140, the silicon oxide layer F21 may not be formed on the lower surface of the Si substrate F2.

The metal layers E21 to E24 and E1 are each formed using, for example, Mo (molybdenum), aluminum (Al), or the like having a thickness of approximately 0.1 to 0.2 μm. The metal layers E21 to E24 and E1 are each formed into a desired shape by etching or the like. The metal layer E1 is, in the vibration portion 120, for example, a lower electrode which is formed so as to function as an applied electrode to which a voltage is applied, a float electrode which is electrically isolated from another electrode, or a ground electrode which is grounded. In the present working example, the lower electrode serves as the float electrode.

In addition, in holding arms 110 and the holding portion 140, the metal layer E1 is formed so as to function as a lower wiring for electrically connecting the lower electrode (applied electrode) to an AC power supply provided outside the resonator 10, or a lower wiring for electrically connecting the lower electrode (ground electrode) to the ground.

On the other hand, in the vibration portion 120, the metal layers E21 to E24 are formed so as to function as an upper electrode. In addition, in the holding arm 110 and the holding portion 140, the metal layers E21 to E24 are formed so as to function as an upper wiring for electrically connecting the upper electrode to a circuit or an AC power supply provided outside the resonator 10.

It is noted that in the electrical connection from the external AC power supply or the ground to the lower wiring, a configuration in which an extended electrode is formed at a bonding portion between the upper cover 30 and the resonator 10 and the extended electrode electrically connects the inside and the outside of the resonance device 1, or a configuration in which a via is formed in the upper cover 30, a via electrode is provided by filling the inside of the via with a conductive material, and the via electrode electrically connects the inside and the outside of the resonance device 1 may be used. The electrical connection using the extended electrode or the via electrode as described above can also be applied to the electrical connection from the external circuit or AC power supply to the upper wiring in the same manner. Note that the functions of the metal layer E1 and the metal layer E2 may be exchanged with each other. That is, the metal layer E2 (i.e., upper electrode) may be electrically connected to the external AC power supply or the ground, and the metal layer E1 (i.e., lower electrode) may be electrically connected to the external circuit or AC power supply.

The piezoelectric thin film F3 is a thin film of a piezoelectric material that converts an applied voltage into vibrations, and for example, can contain, as a main ingredient, a nitride such as AlN (aluminum nitride) or the like or an oxide. Specifically, the piezoelectric thin film F3 can be formed of ScAlN (scandium aluminum nitride). ScAlN is formed by replacing part of aluminum in aluminum nitride with scandium. Furthermore, the thickness of the piezoelectric thin film F3 is, for example, approximately 1 μm, but may be approximately 0.2 μm to 2 μm.

In the cross-sectional view in FIG. 3, the piezoelectric thin film F3 has a shape that gradually narrows as progressing from the metal layer E1 toward each of the metal layers E21 to E24 due to the influence of etching when the plurality of vibration arms 135 is released. In particular, as a width W5 of an opening groove (hereinafter, referred to as a "release width") formed between the respective weight portions G of the vibration arm 135A (135D) in an outer side portion and the vibration arm 135B (135C) adjacent thereto in an inner side portion, a release width W6 between the respective weight portions G of the vibration arms 135B and 135C adjacent to each other in the inner side portion, or a release width W4 between the weight portion G of the vibration arm 135A (135D) in the outer side portion and the holding portion 140 increases, the inclination of the piezoelectric thin film F3 from the metal layer E1 toward each of the metal layers E21 to E24 increases. In the example of FIG. 3, since the release width W6 is larger than the release widths W4 and W5, the inclination at an end portion of the vibration arm 135B on the vibration arm 135C side (that is, the side facing the release width W6) and an end portion of the vibration arm 135C on the vibration arm 135B side (that is, the side facing the release width W6) is larger than the inclination at an end portion on the opposite side (that is, the side facing the release width W5) and both end portions of the vibration arms 135A and 135D (the side facing the release width W4 and the side facing the release width W5).

The protective film 235 is a layer of an insulator, and is formed of a material whose mass reduction rate by etching is lower than that of the conductive film 236. For example, the protective film 235 is formed of a nitride film such as AlN, SiN, or the like, or an oxide film such as $Ta_2O_5$ (tantalum pentoxide), $SiO_2$, or the like. Note that the mass reduction rate is expressed by the product of an etching rate (a thickness removed per unit time) and a density. According to an exemplary aspect, the protective film 235 is formed so as to have a thickness equal to or less than half the thickness (i.e., in the C-axis direction) of the piezoelectric thin film F3, and in the present embodiment, the thickness thereof is, for example, approximately 0.2 μm. Note that a more preferable thickness of the protective film 235 is approximately one fourth of the thickness of the piezoelectric thin film F3. Furthermore, in the case where the protective film 235 is formed of a piezoelectric material such as AlN or the like, it is preferable to use a piezoelectric material having the same orientation as the piezoelectric thin film F3.

The conductive film 236 is a layer of a conductor, and is formed of a material whose mass reduction rate by etching is higher than that of the protective film 235. The conductive film 236 is formed of, for example, a metal such as molybdenum (Mo), tungsten (W), gold (Au), platinum (Pt), nickel (Ni), aluminum (Al), titanium (Ti), or the like.

It is noted that as long as the relationship between the mass reduction rates is as described above, the etching rates of the protective film 235 and the conductive film 236 may be in any magnitude relationship.

The conductive film 236 is formed substantially over the entire surface of the vibration portion 120, and then formed only in a predetermined region by processing such as etching.

The protective film 235 and the conductive film 236 are etched, for example, by simultaneously irradiating the protective film 235 and the conductive film 236 with an ion beam (for example, argon (Ar) ion beam). A wider range than the resonator 10 can be irradiated with the ion beam. Note that although the present embodiment describes an example of etching using an ion beam, the etching method is not limited to that using the ion beam.

Planar Structure

Next, the planar structure of the resonator 10 will be described with reference to FIG. 4.

Vibration Portion 120

The vibration portion 120 has a contour of a comb-tooth shape spreading along the XY plane in the orthogonal coordinate system of FIG. 4. The vibration portion 120 is provided in the inner side portion of the holding portion 140, and a space is formed between the vibration portion 120 and the holding portion 140 at a predetermined interval. In the example of FIG. 4, the vibration portion 120 includes the base or base portion 130 and the four vibration arms 135A to 135D according to the exemplary embodiment. However, it is noted that the number of vibration arms is not limited to four, and is set to an arbitrary number equal to or greater than one, for example. In the present embodiment, the plurality of vibration arms 135 and the base portion 130 are integrally formed.

In a plan view, the base portion 130 has long sides 131a and 131b extending along the X-axis direction, and short sides 131c and 131d extending along the Y-axis direction. The long side 131a is one side of a front end surface 131A of the base portion 130 (hereinafter, also referred to as a "front end 131A"), and the long side 131b is one side of a rear end surface 131B of the base portion 130 (hereinafter, also referred to as a "rear end 131B"). In the base portion 130, the front end 131A and the rear end 131B are provided so as to face each other.

The base portion 130 is connected to the plurality of vibration arms 135 at the front end 131A, and connected to the holding arms 110 at the rear end 131B. Note that although the base portion 130 has a substantially rectangular shape in a plan view in the example illustrated in FIG. 4, the shape is not limited thereto, and it is sufficient to be substantially plane-symmetrically formed with respect to an imaginary plane P defined along a perpendicular bisector of the long side 131a. For example, the base portion 130 may have a trapezoidal shape in which one of the long side 131b and the long side 131a shorter than the other, or a semicircular shape having the long side 131a or the long side 131b as the diameter in alternative aspects. Furthermore, the long sides 131a and 131b and the short sides 131c and 131d are not limited to straight lines, and at least part of each of the sides may be a curved line.

In the base portion 130, a base portion length (the length of each of the short sides 131c and 131d in FIG. 4) which is the longest distance between the front end 131A and the rear end 131B in a direction from the front end 131A toward the rear end 131B is approximately 40 μm. In addition, a base portion width (the length of each of the long sides 131a and 131b in FIG. 4) which is the longest distance between the side ends of the base portion 130 in the width direction orthogonal to a base portion length direction is approximately 285 μm.

The plurality of vibration arms 135 extends in the Y-axis direction, and each arm has the same size. Each of the plurality of vibration arms 135 is provided between the base portion 130 and the holding portion 140 in parallel to the Y-axis direction, and one end thereof is connected to the front end 131A of the base portion 130 and serves as a fixed end, and the other end is an open end. Furthermore, the plurality of vibration arms 135 is provided in parallel at predetermined intervals in the X-axis direction. Note that each of the plurality of vibration arms 135 has, for example, a width of approximately 50 μm in the X-axis direction and a length of approximately 420 µm in the Y-axis direction according to an exemplary aspect.

Each of the plurality of vibration arms 135 has the weight portion G at the open end thereof. The weight portion G has a width in the X-axis direction larger than that of the other sections of the plurality of vibration arms 135. The weight portion G has, for example, a width of approximately 70 µm in the X-axis direction. The weight portion G is formed integrally with the other sections of the plurality of vibration arms 135 through the same process. By forming the weight portion G, the weight per unit length in each of the plurality of vibration arms 135 is heavier on the open end side than on the fixed end side. Accordingly, the plurality of vibration arms 135 each has the weight portion G on the open end side, whereby it is possible to increase the amplitude of vibration in the up-down direction in each of the plurality of vibration arms 135.

In the vibration portion 120 according to the present embodiment, in the X-axis direction, the two vibration arms 135A and 135D are arranged in the outer side portion, and the two vibration arms 135B and 135C are arranged in the inner side portion.

The upper electrodes E21 to E24 are respectively formed in the vibration arms 135A to 135D from the vicinities of the fixed ends to the vicinities of portions where the weight portions G are respectively formed of the plurality of vibration arms 135. Furthermore, the protective film 235 is formed over the entire surface of the vibration portion 120 on the front surface (the surface facing the upper cover 30) side. Furthermore, the conductive film 236 is formed on part of the front surface of the protective film 235 of each of the plurality of vibration arms 135. By the protective film 235 and the conductive film 236, the resonant frequency of the vibration portion 120 can be adjusted. It is noted that the protective film 235 does not necessarily have to be provided over the entire surface of the vibration portion 120, but providing over the entire surface of the vibration portion 120 is more preferable in order to protect the upper electrodes E21 to E24 and the piezoelectric thin film F3 which are foundations from damage in the resonant frequency adjustment.

The conductive film 236 is formed on the protective film 235 in such a manner that the front surface thereof is exposed in at least part of a region having a larger average displacement due to vibration than the other region of the vibration portion 120. Specifically, the conductive film 236 is formed on the protective film 235 at the tip end, that is, at the weight portion G of each of the plurality of vibration arms 135. On the other hand, the front surface of the protective film 235 is exposed in a region other than the weight portion G of each of the plurality of vibration arms 135. In this working example, the conductive film 236 is formed to the tip end of each of the plurality of vibration arms 135, and the protective film 235 is not exposed at the tip end portion at all. However, the conductive film 236 may not be formed on at least one tip end portion of the plurality of vibration arms 135 such that part of the protective film 235 is exposed on at least one tip end portion of the plurality of vibration arms 135. Note that a second conductive film may also be formed on the base side (the side connected to the base portion 130) of each of the plurality of vibration arms 135, and such a second conductive film is formed on, for example, the protective film 235. In this case, it is possible to suppress change in temperature characteristics of the frequency associated with the resonant frequency adjustment.

Holding Portion 140

The holding portion 140 (generally referred to as a frame) is formed in a rectangular frame-like shape along the XY plane. The holding portion 140 is provided so as to surround an outer side portion of the vibration portion 120 along the XY plane in a plan view. Note that it is sufficient that the holding portion 140 is provided in at least part of the periphery of the vibration portion 120, and the shape is not limited to a frame-like shape. For example, it is sufficient that the holding portion 140 is provided in the periphery of the vibration portion 120 to such an extent as to be able to hold the vibration portion 120 and to be able to be bonded to the upper cover 30 and the lower cover 20.

In the present embodiment, the holding portion 140 is comprises prism-shaped frame bodies 140a to 140d that are integrally formed. As illustrated in FIG. 4, the frame body 140a is provided so as to face the open ends of the plurality of vibration arms 135, such that the longitudinal direction thereof is parallel to the X axis. The frame body 140b is provided so as to face the rear end 131B of the base portion 130, such that the longitudinal direction thereof is parallel to the X axis. The frame body 140c is provided so as to face a side end (e.g., short side 131c) of the base portion 130 and the vibration arm 135A, such that the longitudinal direction thereof is parallel to the Y axis, and both ends thereof are connected to one ends of the frame bodies 140a and 140b, respectively. The frame body 140d is provided so as to face a side end (e.g., short side 131d) of the base portion 130 and the vibration arm 135D, such that the longitudinal direction thereof is parallel to the Y axis, and both ends thereof are connected to the other ends of the frame bodies 140a and 140b, respectively.

In the present embodiment, although the description is given by assuming that the protective film 235 is formed over substantially the entire surface of the holding portion 140, the configuration is not limited thereto, and the protective film 235 may not be formed on the front surface of the holding portion 140.

Holding Arm 110

The holding arm 110 is provided in an inner side portion of the holding portion 140, and connects the rear end 131B of the base portion 130 and the frame body 140b to each other. As illustrated in FIG. 4, the holding arm 110 is formed to be substantially plane-symmetric with respect to an imaginary plane P defined in parallel to the YZ plane along the center line in the X-axis direction of the base portion 130. It should be appreciated that the shape of the holding arm 110 is not limited to the example illustrated in FIG. 4, and, for example, a pair of holding arms in which other ends are respectively connected to the frame bodies 140c and 140d after being bent a plurality of times may be employed.

Relationship Between Gap Width and Release Width

A relationship between a gap width and a release width will be described with reference to FIGS. 3 and 4.

In the periphery of the vibration portion 120, opening grooves having different widths in a predetermined direction (an example of a first direction) in a plan view of the main surface of the Si substrate F2 are provided. In the present embodiment, the predetermined direction is described as the X-axis direction, but is not limited thereto, and the direction may be, in addition to the Y-axis direction, an arbitrary direction in the XY plane in FIG. 4.

The release width refers to a width along the predetermined direction (that is, the X-axis direction in the present embodiment) of the opening groove. More specifically, it refers to a distance, along the predetermined direction (that is, the X-axis direction in the present embodiment), between the Si substrates F2 forming the side walls of the opening grooves, when the Si substrate F2 is viewed in a plan view. It is also noted that the distance between the Si substrates F2 along the predetermined direction refers to, for example, the distance between edges of the lower surfaces (lower cover 20 side) of the Si substrates F2. For example, the release width is the release width W5 of the opening groove formed between the respective weight portions G of the vibration arm 135A and the vibration arm 135B (or the vibration arm 135C and the vibration arm 135D), the release width W6 of the opening groove formed between the respective weight portions G of the vibration arm 135B and the vibration arm 135C, and the release width W4 of the opening groove formed between the weight portion G of the vibration arm 135A and the frame body 140c (or the weight portion G of the vibration arm 135D and the frame body 140d), illustrated in FIG. 3 and FIG. 4. Furthermore, as illustrated in FIG. 4, an opening groove having a release width W1 is formed between sections other than the respective weight portions G of the vibration arm 135A and the vibration arm 135B (or the vibration arm 135D and the vibration arm 135C), an opening groove having a release width W2 is formed between sections other than the respective weight portions G of the vibration arm 135B and the vibration arm 135C, and an opening groove having a release width W3 is formed between a section other than the weight portion G of the vibration arm 135A and the frame body 140c (or a section other than the weight portion G of the vibration arm 135D and the frame body 140d). Note that the release width may be a distance between edges of the upper surface (upper cover side) of the Si substrate when the Si substrate is viewed in a plan view from the upper cover side.

In the present embodiment, the release width W2 is set to be larger than the release width W1, where the release width W2 is approximately 35 μm, for example, and the release width W1 is approximately 25 μm, for example. In other words, the release width W2 between the vibration arm 135B and the vibration arm 135C in the X-axis direction is set to be larger than the release width W1 between the vibration arm 135A (135D) in the outer side portion and the vibration arm 135B (135C) in the inner side portion adjacent to the vibration arm 135A (135D) in the outer side portion in the X-axis direction. By setting the release width W2 to be larger than the release width W1, the vibration characteristics are improved by this configuration. However, it is also noted that in order to enable reduction in size of the resonance device 1, the release width W2 may be set to be smaller than the release width W1, or may be set at an equal interval. Furthermore, in the present embodiment, for example, the release width W6 is set to be larger than the release widths W4 and W5, and the release width W4 is set to be larger than the release width W5. Furthermore, the release width W6 is set to be smaller than the release width W2, the release width W5 is set to be smaller than the release width W1, and the release width W4 is set to be smaller than the release width W3.

Furthermore, in the present embodiment, the release width W3 is set to be the same width as the release width W1, but the configuration is not limited thereto, and the release widths W3 and W1 may be in any magnitude relationship.

On the other hand, a gap width of the upper electrode refers to a distance between an outer edge of each of the upper electrodes E21 to E24 and an outer edge of the Si substrate F2 on which the upper electrodes E21 to E24 are each formed when the Si substrate F2 is viewed in a plan view. Furthermore, a gap width of the conductive film refers to a distance between an outer edge of the conductive film 236 and an outer edge of the Si substrate F2 on which the conductive film 236 is formed when the Si substrate F2 is viewed in a plan view. It is also noted that the outer edge of the Si substrates F2 refers to, for example, an edge of the lower surface (lower cover 20 side) of the Si substrate F2. The outer edges of the upper electrodes E21 to E24 refer to, for example, edges of the lower surfaces (lower cover 20 side) of the upper electrodes E21 to E24. The outer edge of the conductive film 236 refers to, for example, an edge of the lower surface (lower cover 20 side) of the conductive film 236. Hereinafter, the "outer edge" of each of the Si substrate, the conductive film, and the upper electrode is also simply referred to as an "edge". It is further noted that the outer edge of the Si substrate F2 may be an edge of the upper surface (upper cover 30 side) of the Si substrate F2.

For example, as for the gap width of the upper electrode in the section other than the weight portion G of the vibration arm 135B, a gap width L2 is a distance between an edge, facing the vibration arm 135C, of the upper electrode E22 formed in the section other than the weight portion G of the vibration arm 135B and an edge, facing the vibration arm 135C, of the Si substrate F2 formed in the section other than the weight portion G of the vibration arm 135B. Furthermore, a gap width L1 is a distance, on the opposite side from the edge where the gap width L2 is set, between an edge of the upper electrode E22 and an edge of the vibration arm 135B (that is, an edge, facing the vibration arm 135A, of the upper electrode E22 formed in the section other than the weight portion G of the vibration arm 135B, and an edge, facing the vibration arm 135A, of the Si substrate F2 formed in the section other than the weight portion G of the vibration arm 135B).

As for the gap width of the upper electrode in the weight portion G of the vibration arm 135B, a gap width L6 is a distance between an edge, facing the vibration arm 135C, of the upper electrode E22 formed in the weight portion G of the vibration arm 135B and an edge, facing the vibration arm 135C, of the Si substrate F2 formed in the weight portion G of the vibration arm 135B. Furthermore, a gap width L5 is a distance between an edge, facing the vibration arm 135A, of the upper electrode E22 formed in the weight portion G of the vibration arm 135B and an edge, facing the vibration arm 135A, of the Si substrate F2 formed in the weight portion G of the vibration arm 135B.

As for the gap width of the conductive film at the weight portion G of the vibration arm 135B, a gap width L11 is a distance between an edge, facing the vibration arm 135C, of the conductive film 236 formed on the weight portion G of the vibration arm 135B and an edge, facing the vibration arm 135C, of the Si substrate F2 formed in the weight portion G of the vibration arm 135B. Furthermore, a gap width L10 is a distance between an edge, facing the vibration arm 135A, of the conductive film 236 formed on the weight portion G of the vibration arm 135B and an edge, facing the vibration arm 135A, of the Si substrate F2 formed in the weight portion G of the vibration arm 135B.

In other words, in the section other than the weight portion G of the vibration arm 135B, the gap width L1 of the upper electrode is formed at the portion facing the release width W1 (a region where the release width W1 is set), and the gap width L2 of the upper electrode is formed at the portion facing the release width W2. In addition, in the weight portion G of the vibration arm 135B, the gap width L5 of the upper electrode and the gap width L10 of the conductive film are formed at the portion facing the release width W5, and the gap width L6 of the upper electrode and the gap width L11 of the conductive film are formed at the portion facing the release width W6.

In the same manner, as for the gap width of the upper electrode in the section other than the weight portion G of the vibration arm 135A, a gap width L3 is a distance between an edge, facing the frame body 140c, of the upper electrode E21 formed in the section other than the weight portion G of the vibration arm 135A and an edge, facing the frame body 140c, of the Si substrate F2 formed in the section other than the weight portion G of the vibration arm 135A. Furthermore, the gap width L1 is a distance, on the opposite side from the edge where the gap width L3 is set, between an edge of the upper electrode E21 and an edge of the vibration arm 135A. In other words, an edge that is facing the vibration arm 135B of the upper electrode E21 formed in the section other than the weight portion G of the vibration arm 135A, and an edge, facing the vibration arm 135B, of the Si substrate F2 formed in the section other than the weight portion G of the vibration arm 135A.

As for the gap width of the upper electrode in the weight portion G of the vibration arm 135A, a gap width L4 is a distance between an edge, facing the frame body 140c, of the upper electrode E21 formed in the weight portion G of the vibration arm 135A and an edge, facing the frame body 140c, of the Si substrate F2 formed in the weight portion G of the vibration arm 135A. Furthermore, the gap width L5 is a distance between an edge, facing the vibration arm 135B, of the upper electrode E21 formed in the weight portion G of the vibration arm 135A and an edge, facing the vibration arm 135B, of the Si substrate F2 formed in the weight portion G of the vibration arm 135A.

As for the gap width of the conductive film at the weight portion G of the vibration arm 135A, a gap width L9 is a distance between an edge, facing the frame body 140c, of the conductive film 236 formed on the weight portion G of the vibration arm 135A and an edge, facing the frame body 140c, of the Si substrate F2 formed in the weight portion G of the vibration arm 135A. Furthermore, the gap width L10 is a distance between an edge, facing the vibration arm 135B, of the conductive film 236 formed on the weight portion G of the vibration arm 135A and an edge, facing the vibration arm 135B, of the Si substrate F2 formed in the weight portion G of the vibration arm 135A.

In other words, in the section other than the weight portion G of the vibration arm 135A, the gap width L1 of the upper electrode is formed at the portion facing the release width W1 (a region where the release width W1 is set), and the gap width L3 of the upper electrode is formed at the portion facing the release width W3. In addition, in the weight portion G of the vibration arm 135A, the gap width L5 of the upper electrode and the gap width L10 of the conductive film are formed at the portion facing the release width W5, and the gap width L4 of the upper electrode and the gap width L9 of the conductive film are formed at the portion facing the release width W4.

It is also noted that the gap widths of the vibration arms 135C and 135D have configurations symmetrical to those of the vibration arms 135B and 135A, respectively, and description thereof will therefore be omitted.

Note that, in the case where the release width W2 is set to approximately 35 μm and the release widths W1 and W3 are each set to approximately 25 μm, the gap width L1 is preferably approximately equal to or greater than 0.3 μm and approximately equal to or smaller than 10 μm, the gap width L2 is preferably approximately equal to or greater than 0.5 μm and approximately equal to or smaller than 10 μm, and the gap width L3 is preferably approximately equal to or greater than 0.3 μm and approximately equal to or smaller than 10 μm.

Figure 5:
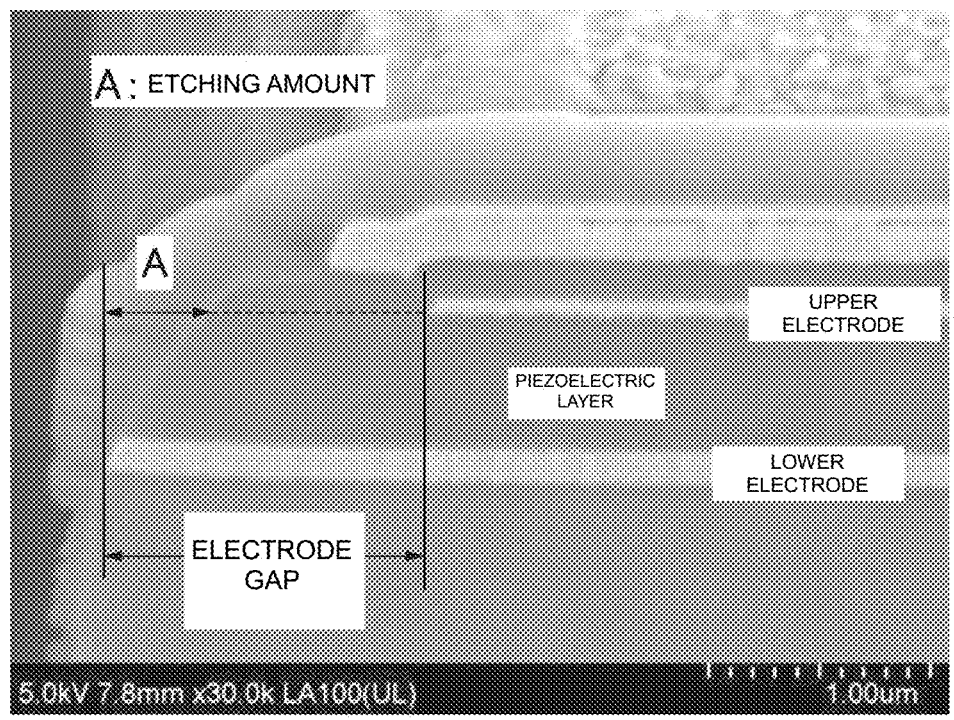
FIG. 5 is a cross-sectional photograph of a vibration arm.

Here, a relationship between the release width and an etching amount will be described with reference to FIG. 5 and FIG. 6. FIG. 5 is a photograph illustrating a cross-sectional structure of the vibration arm. The etching amount refers to the amount of the piezoelectric thin film F3 etched more than the release width when the Si substrate F2 is released by etching. For example, the etching amount in the photograph of FIG. 5 refers to the difference A in position between the end portion of the Si substrate F2 on the metal layer E1 side (the edge of the upper surface of the Si substrate F2) and the end portion of the piezoelectric thin film F3 on the metal layer E21 side (the edge of the upper surface of the piezoelectric thin film F3).

Figure 6:
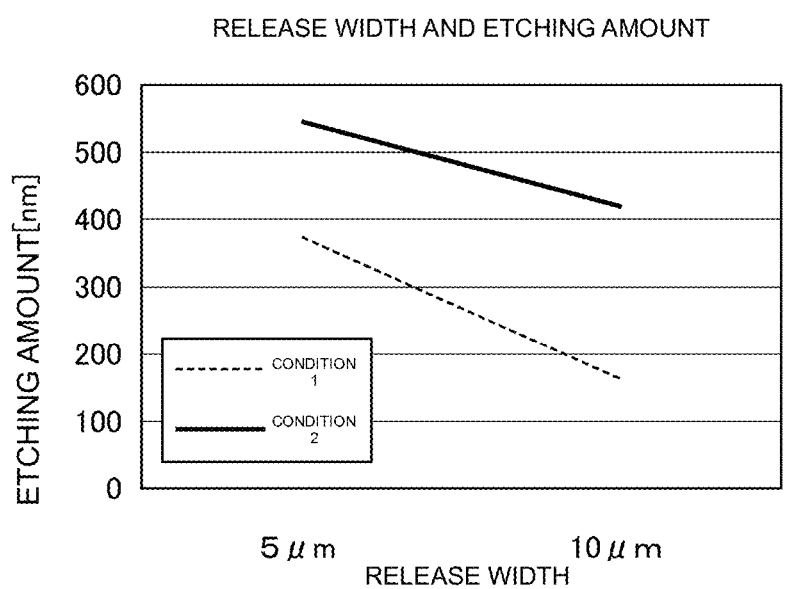
FIG. 6 is a graph showing a relationship between a release width and an etching amount.

FIG. 6 is a graph showing a relationship between the release width and the etching amount. In the graph of FIG. 6, the horizontal axis represents the width to be released by etching, and the vertical axis represents the etching amount. FIG. 6 shows two kinds of measurement results obtained by changing conditions such as etching time, a concentration of reaction gas used for the etching, and the like. As shown in FIG. 6, in both conditions, the etching amount decreases as the release width increases.

For this reason, when the upper electrode is formed with the gap width made to be constant regardless of the release width, the piezoelectric thin film F3 is scraped to the inner side portion relative to the region where the upper electrode is formed in some cases, depending on the etching amount. In this case, the upper electrode and the lower electrode are short-circuited to each other in some cases. Accordingly, in the resonator 10 according to the present embodiment, the gap width of the upper electrode in a region having a large release width is set to be larger than the gap width of the upper electrode in a region having a small release width in order to prevent a short circuiting of the electrodes.

Specifically, in the present embodiment, the release width W2 is set to be largest among the release widths W1, W2, and W3. Accordingly, the gap width L2 of the region where the release width W2 is set is set to be larger than the gap widths L1 and L3 of the regions where the release widths W1 and W3 are respectively set. On the other hand, in the present embodiment, since the release widths W1 and W3 have the same size, the gap width L1 of the region where the release width W1 is set and the gap width L3 of the region where the release width W3 is set are set to have substantially the same size in the exemplary embodiment as shown in FIG. 4. Furthermore, in the present embodiment, the release width W6 is set to be larger than the release width W4, and the release width W4 is set to be larger than the release width W5 (W6>W4>W5). Accordingly, it is desirable that the gap width L6 be set to be larger than the gap width L4, and the gap width L4 be set to be larger than the gap width L5 (L6>L4>L5).

In the present embodiment, the width of the upper electrode is formed to be constant, whereas the width of the vibration arm is formed to be wider at the weight portion G at the tip or free end. Accordingly, although the release width W6 is set to be smaller than the release width W2, the gap width L6 is set to be larger than the gap width L2 (W6<W2 and L6>L2). In the same manner, the widths are set so as to satisfy W5<W1 and L5>L1, and W4<W3 and L4>L3.

In the same manner as the lower electrode, the conductive film is also short-circuited, in some cases, to the upper electrode depending on the etching amount. Accordingly, in the resonator 10 according to the present embodiment, from a viewpoint of preventing short circuit between the conductive film and the upper electrode, it is desirable that the gap width of the upper electrode in a region having a large release width be set to be larger than the gap width of the conductive film in a region having a small release width.

Specifically, in the present embodiment, the gap width L2 of the upper electrodes E22 and E23 in the region where the release width W2 is set is set to be larger than the gap width L11 of the conductive film 236 in the region where the release width W6 smaller than the release width W2 is set. The gap width L1 of the upper electrodes E21 to E24 in the region where the release width W1 is set is set to be larger than the gap width L10 of the conductive film 236 in the region where the release width W5 smaller than the release width W1 is set. The gap width L3 of the upper electrodes E21 and E24 in the region where the release width W3 is set is set to be larger than the gap width L9 of the conductive film 236 in the region where the release width W4 smaller than the release width W3 is set.

Furthermore, the gap width L6 of the upper electrodes E22 and E23 in the region where the release width W6 is set is set to be larger than the gap widths L9 and L10 of the conductive film 236 in the region where the release widths W4 and W5 smaller than the release width W6 are set. The gap width L4 of the upper electrodes E21 and E24 in the region where the release width W4 is set is set to be larger than the gap width L10 of the conductive film 236 in the region where the release width W5 smaller than the release width W4 is set.

In the resonator 10 according to the present embodiment, from a viewpoint of preventing short circuit between the conductive film and the upper electrode, it is desirable that the gap width of the upper electrode be set to be larger than the gap width of the conductive film in a region having a large release width, and the gap width of the upper electrode be set to be larger than the gap width of the conductive film in a region having a small release width as well.

Specifically, in the present embodiment, in the region where the release width W6 is set, the gap width L2 of the upper electrodes E22 and E23 is set to be larger than the gap width L11 of the conductive film 236. Furthermore, in the region where the release width W5 is set, the gap width L5 of the upper electrodes E21 to E24 is set to be larger than the gap width L10 of the conductive film 236. Furthermore, in the region where the release width W4 is set, the gap width L4 of the upper electrodes E21 and E24 is set to be larger than the gap width L9 of the conductive film 236.

As described above, in the resonator 10 according to the present embodiment, the gap width of the upper electrode in a region having a large release width is set to be larger than the gap width of the upper electrode in a region having a small release width, thereby making it possible to prevent the upper electrode and the lower electrode from short-circuiting. Furthermore, the gap width of the upper electrode in a region having a large release width is set to be larger than the gap width of the conductive film in a region having a small release width, thereby making it possible to prevent the conductive film and the upper electrode from short-circuiting. Furthermore, the gap width of the upper electrode is set to be larger than the gap width of the conductive film in a region having a large release width, and the gap width of the upper electrode is set to be larger than the gap width of the conductive film in a region having a small release width as well, thereby making it possible to prevent the conductive film and the upper electrode from short-circuiting.

Function of Resonator

The function of the resonator 10 will be described with reference to FIG. 7. FIG. 7 illustrates a cross section of the plurality of vibration arms 135, taken along a line DD' in FIG. 4, and schematically illustrates an electrical connection state of the plurality of vibration arms 135. The piezoelectric thin film F3 expands and contracts in the in-plane direction of the XY plane, that is, in the Y-axis direction, in accordance with an electric field applied to the piezoelectric thin film F3 by each of the metal layers E21 to E24 and E1. With the expansion and contraction of the piezoelectric thin film F3, the plurality of vibration arms 135 displaces the open ends thereof toward the inner surfaces of the lower cover 20 and the upper cover 30, and vibrates in an out-of-plane bending vibration mode.

In the present embodiment, the phase of an electric field applied to the vibration arms 135A and 135D in the outer side portion and the phase of an electric field applied to the vibration arms 135B and 135C in the inner side portion are set to have mutually reverse phases. With this configuration, the vibration arms 135A and 135D in the outer side portion and the vibration arms 135B and 135C in the inner side portion are displaced in reverse directions to each other. For example, when the vibration arms 135A and 135D in the outer side portion displace the open ends toward the inner surface of the upper cover 30, the vibration arms 135B and 135C in the inner side portion displace the open ends toward the inner surface of the lower cover 20.

As a result, in the resonator 10 according to the present embodiment, during the vibration with the reverse phases, that is, around a center axis r1 extending in parallel to the Y axis between the vibration arm 135A and the vibration arm 135B as illustrated in FIG. 7, the vibration arm 135A and the vibration arm 135B vibrate reversely to each other in the up-down direction. Furthermore, around a center axis r2 extending in parallel to the Y axis between the vibration arm 135C and the vibration arm 135D, the vibration arm 135C and the vibration arm 135D vibrate reversely to each other in the up-down direction. This generates torsion moments around the center axes r1 and r2 in the reverse directions to each other, and bending vibration is generated in the base portion 130.

It is also noted that in the present embodiment, in the resonator 10 that includes the four vibration arms 135 and takes the out-of-plane bending vibration mode as the main vibration, the upper electrodes E21 to E24 are separately and electrically connected to AC power supplies, respectively. A voltage with a reverse phase to that of each of the upper electrodes E22 and E23 of the vibration arms 135B and 135C in the inner side portion is applied to each of the upper electrodes E21 and E24 of the vibration arms 135A and 135D in the outer side portion. With this configuration, according to the present embodiment, although the vibration arms 135B and 135C in the inner side portion and the vibration arms 135A and 135D in the outer side portion are configured to make bending vibration in reverse directions to each other, the number of vibration arms and the vibration mode are not limited thereto. The embodiment according to the present invention may have, for example, a configuration in which one to three vibration arms are included, or a configuration in which five or more vibration arms are included, or may have a configuration in which the vibration of in-plane bending vibration mode is performed.

Process Flow

Figure 8A:
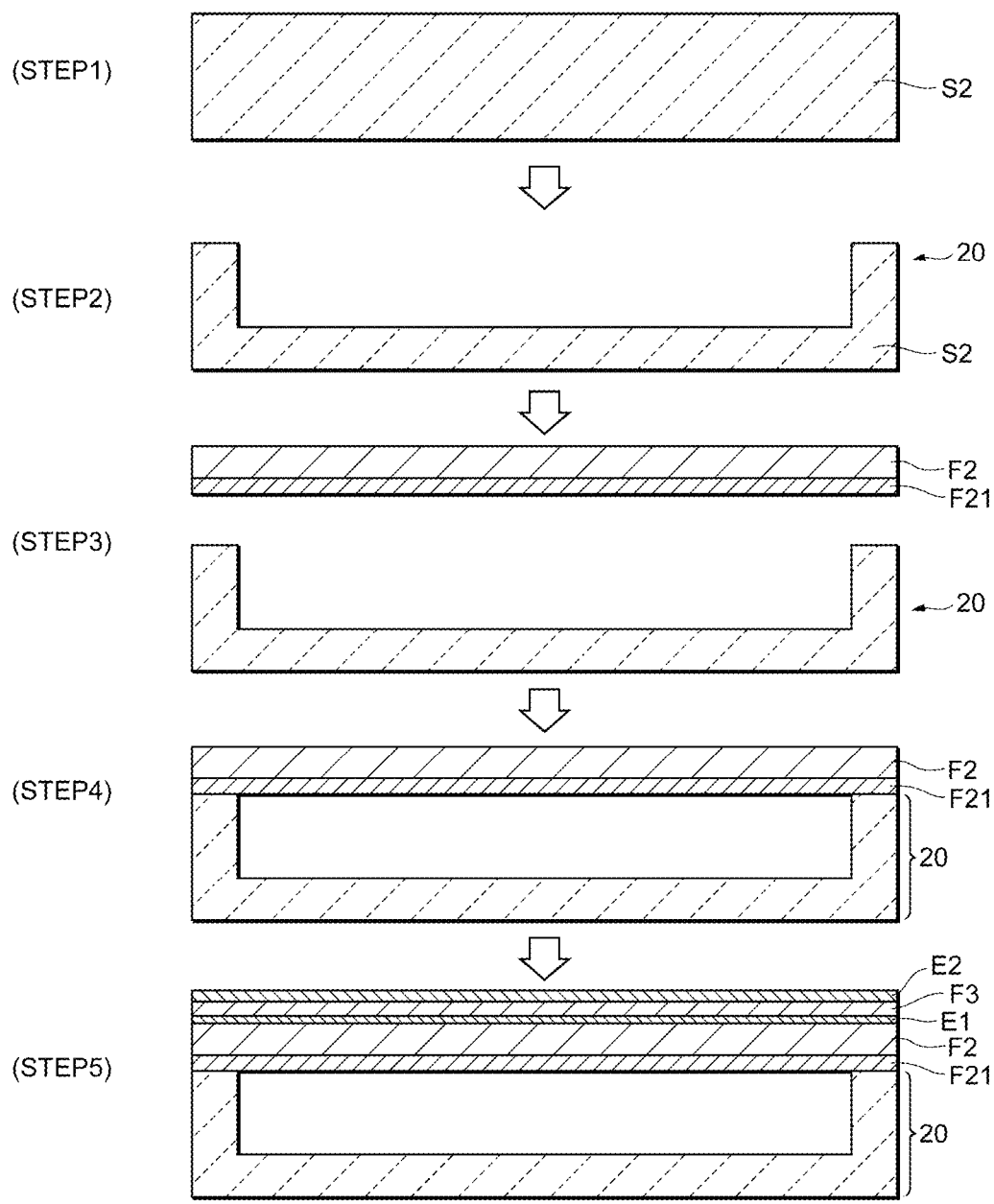
FIG. 8A is a diagram illustrating an example of a process flow of the resonance device according to the first exemplary embodiment.
Figure 8B:
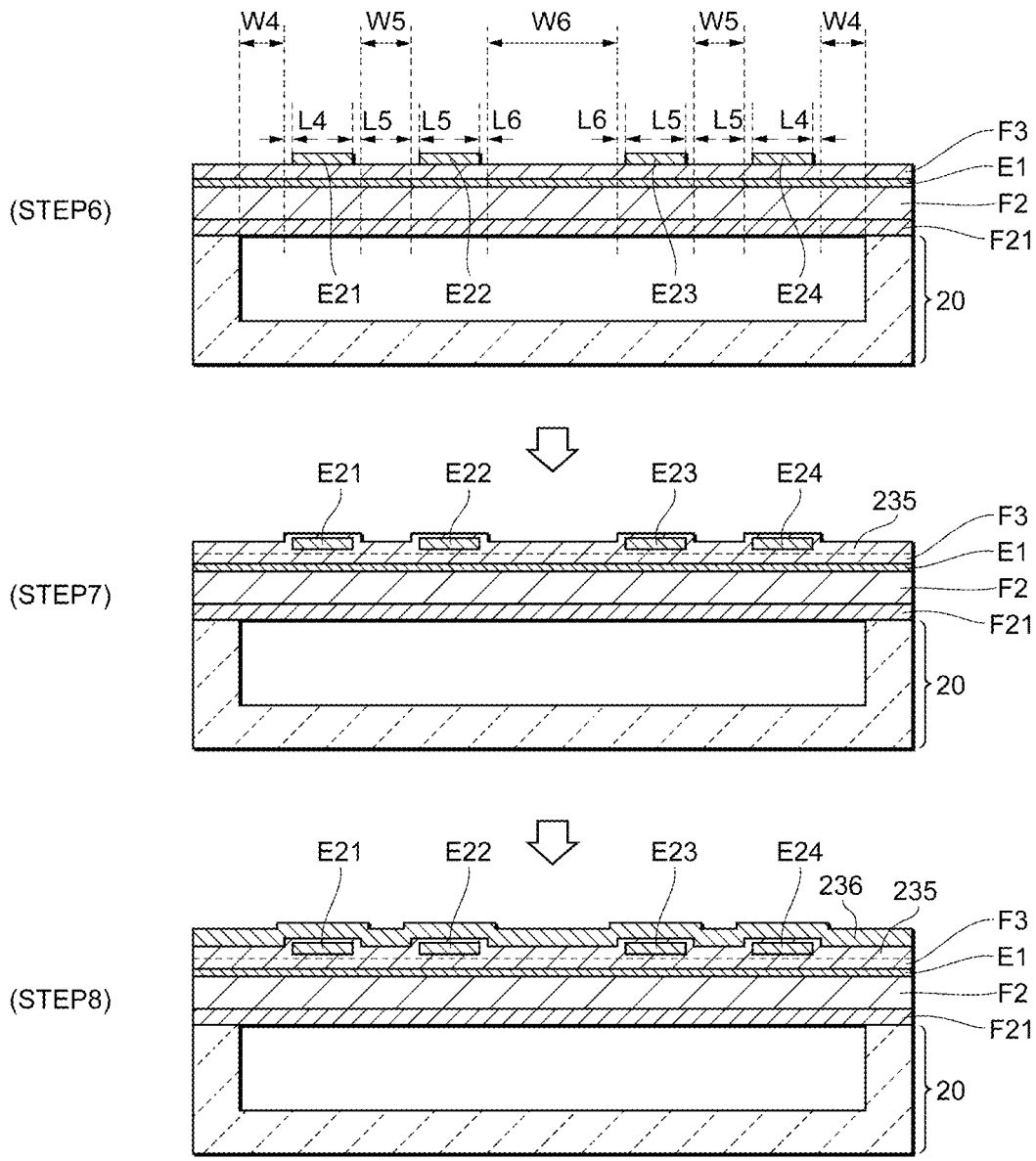
FIG. 8B is a diagram illustrating an example of a process flow of the resonance device according to the first exemplary embodiment.
Figure 8C:
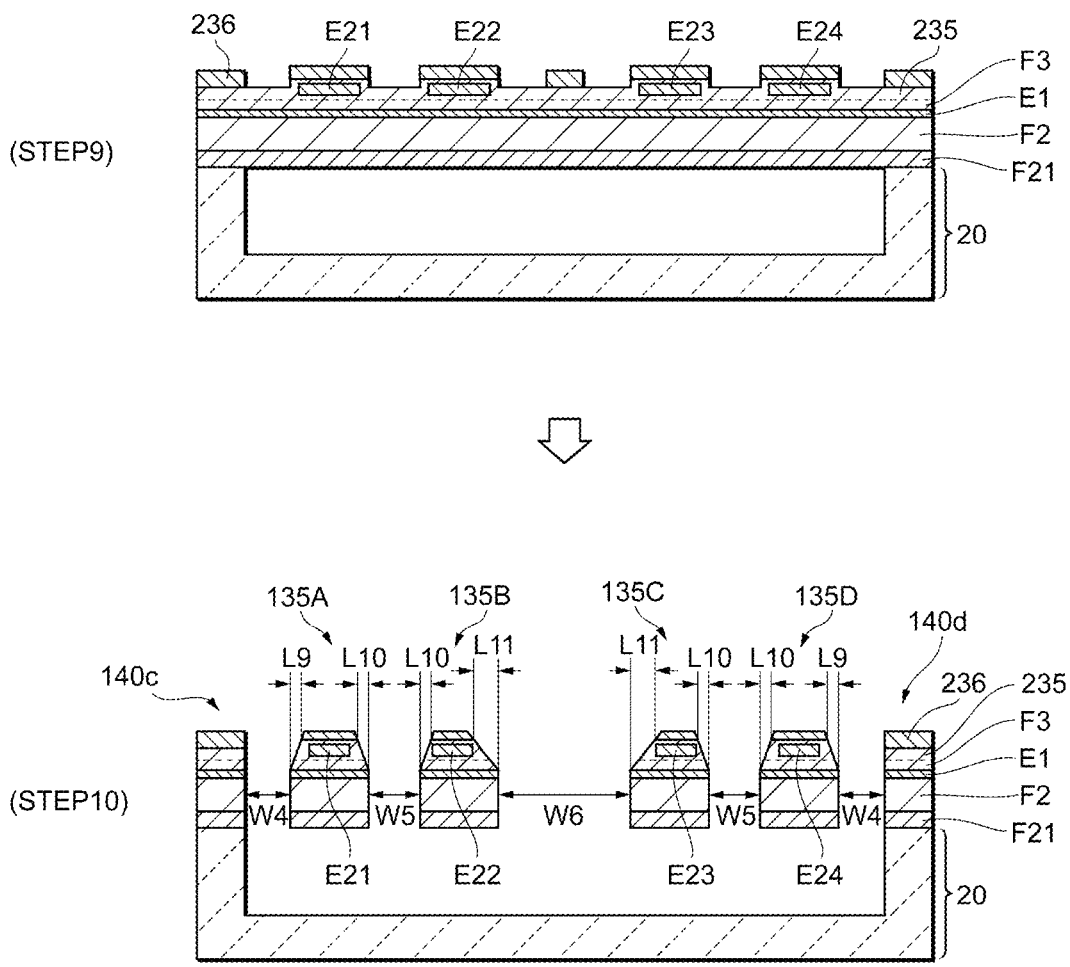
FIG. 8C is a diagram illustrating an example of a process flow of the resonance device according to the first exemplary embodiment.

Next, the process flow of the resonance device 1 will be described with reference to FIG. 8A to FIG. 8C. FIG. 8A to FIG. 8C illustrate steps of the process flow of a cross section of the resonance device, taken along an extension line of the line DD' in FIG. 4.

First, referring to FIG. 8A, in the first step, a handle Si (Si wafer S2) to be the lower cover 20 is prepared (STEP 1). Next, a cavity is formed in the handle Si by etching, and the lower cover 20 is formed (STEP 2) and is thermally bonded to an SOI substrate (Si substrate F2 on which a silicon oxide film F21 is formed) which is separately prepared in STEP 3 (STEP 4). Next, on the SOI substrate, the metal layer E1, the piezoelectric thin film F3, and the metal layer E2 are film-formed in this order (STEP 5). Note that a seed layer may be film-formed between the metal layer E1 and the Si substrate F2 according to an exemplary aspect. The seed layer is, for example, an aluminum nitride layer or the like. In this case, it is possible to improve the crystallinity of the piezoelectric thin film F3 formed on the metal layer E1.

Next, referring to FIG. 8B, in STEP 6 subsequent to STEP 5 described above, the metal layer E2 is patterned by etching or the like, and the upper electrodes E21 to E24 are formed (STEP 6). At this time, the gap widths (L4 to L6) of the upper electrodes E21 to E24 are set on the basis of the release widths (W4 to W6) at the weight portions G of the plurality of vibration arms 135 on which the upper electrodes E21 to E24 are respectively formed.

Specifically, the gap width L6 of a region where the release width W6 is set is set to be larger than the gap width L5 of a region where the release width W5 is set. Then, the metal layer E2 formed in a region where the vibration arm 135B is to be formed is shaped to be the upper electrode E22, by being removed by an amount corresponding to the gap width L6 relative to the end portion, on the vibration arm 135C side, of the Si substrate F2 of the vibration arm 135B, and by being removed by an amount corresponding to the gap width L5 relative to the end portion, on the vibration arm 135A side, of the Si substrate F2 of the vibration arm 135B. In the same manner, the metal layer E2 formed in a region where the vibration arm 135A is to be formed is shaped to be the upper electrode E21, by being removed by an amount corresponding to the gap width L5 relative to the end portion, on the vibration arm 135B side, of the Si substrate F2 of the vibration arm 135A, and by being removed by an amount corresponding to the gap width L4 relative to the end portion, on the frame body 140c side, of the Si substrate F2 of the vibration arm 135A. Note that the upper electrodes E23 and E24 have configurations symmetrical to those of the upper electrodes E22 and E21, respectively, and detailed description thereof will therefore be omitted.

Note that when the metal layer E1, the piezoelectric thin film F3, and the metal layer E2 are film-formed in STEP 5, the metal layer E1 and the piezoelectric thin film F3 may be patterned. Next, the protective film 235 and the conductive film 236 are film-formed in this order (STEP 7 and STEP 8).

Next, referring to FIG. 8C, in a subsequent step, the conductive film 236 is patterned (STEP 9). Specifically, the conductive film 236 is removed such that the conductive film 236 remains on the weight portion G in each of the plurality of vibration arms 135, from the other region. At this time, for wiring, the conductive film 236 may remain on the holding portion 140.

Furthermore, in order to form the outer shape of the vibration portion 120, release is performed at portions between the plurality of vibration arms 135 and at portions between each of the plurality of vibration arms 135 and the holding portion 140 by etching or the like (STEP 10). In the release by etching, for example, the patterned conductive film 236 is used as a mask. At this time, a cross-sectional shape of each of the plurality of vibration arms 135 is a tapered shape whose width increases as progressing from the conductive film 236 toward the Si substrate F2 as shown in STEP 10. As a result, in the vibration arm 135A, the gap width L9 is formed on the adjacent frame body 140c side in the X-axis direction, and the gap width L10 is formed on the adjacent vibration arm 135B side in the X-axis direction. In the same manner, in the vibration arm 135B, the gap width L10 is formed on the adjacent vibration arm 135A side in the X-axis direction, and the gap width L11 is formed on the adjacent vibration arm 135C side in the X-axis direction. Note that since the vibration arms 135C and 135D have structures symmetrical to those of the vibration arms 135B and 135A, respectively, and detailed description thereof will therefore be omitted. Thereafter, bonding with the upper cover 30 which is the separately prepared is performed, and the resonance device 1 is formed.

Second Exemplary Embodiment

In a second embodiment and subsequent embodiments, description of matters which are common to those in the first embodiment will be omitted, and only different points will be described. In particular, the same actions and effects by the same configurations are not stated for each subsequent embodiment as described below.

Figure 9:
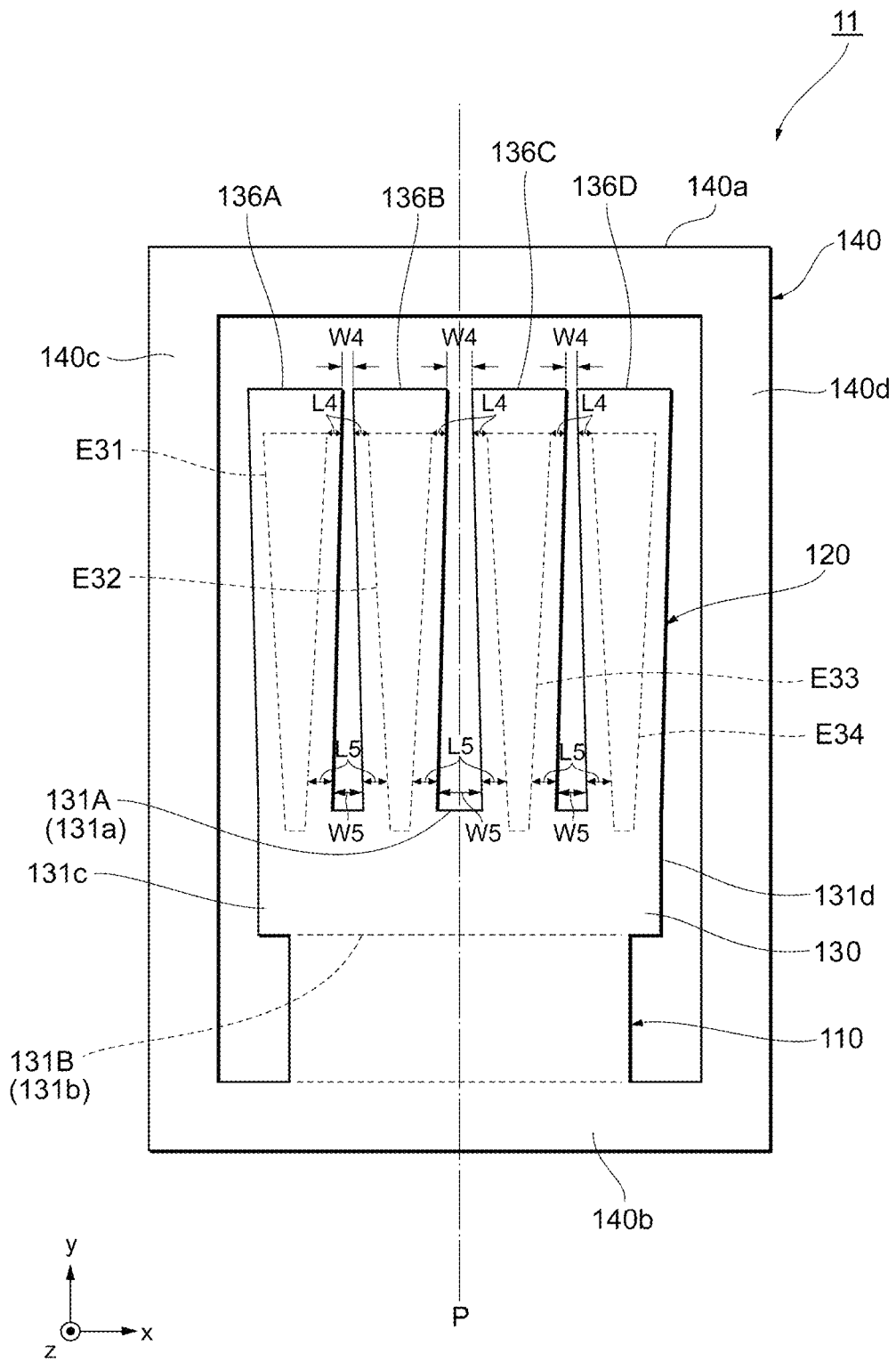
FIG. 9 is a plan view of a resonator according to a second exemplary embodiment.

FIG. 9 corresponds to FIG. 4, and schematically illustrates an example of a planar structure of a resonator 11 according to the present embodiment. Hereinafter, description will be given focusing on different points from the first embodiment, of the configuration of the resonator 11 according to the present embodiment. The resonator 11 includes vibration arms 136A to 136D and metal layers E31 to E34 instead of the vibration arms 135A to 135D and the metal layers E21 to E24 described in the first embodiment.

The vibration arm 136A has a shape in which the width (that is, the size along a direction in which the vibration arms 136A to 136D are arranged) gradually increases as progressing from the fixed end toward the open end. Accordingly, in an opening groove between the vibration arm 136A and the vibration arm 136B adjacent thereto, the release width W4 on the open end side is set to be smaller than the release width W5 on the fixed end side. For example, the release width W5 is approximately 35 μm, and the release width W4 is approximately 25 μm. Furthermore, in the example in FIG. 9, although the vibration arm 136A does not include the weight portion G, a configuration may be such that the weight portion G is formed at the open end of the vibration arm 136A. The other configuration of the vibration arm 136A is the same as that of the vibration arm 135A. Note that the configurations of the vibration arms 136B to 136D are the same as that of the vibration arm 136A, and description thereof will therefore be omitted.

The metal layer E31 is formed in the vibration arm 136A. In the gap width from the edge of the metal layer E31 to the edge of the vibration arm 136A, the gap width L5 at the fixed end of the vibration arm 136A is set to be larger than the gap width L4 at the open end of the vibration arm 136A. For example, the gap width L5 is approximately 1.0 μm, and the gap width L4 is approximately 0.5 μm. The other configuration of the metal layer E31 is the same as that of the metal layer E21. It is also noted that the configurations of the metal layers E32 to E34 are the same as that of the metal layer E31, and description thereof will therefore be omitted.

The other configuration and function of the resonator 11 are the same as those of the resonator 10.

Third Exemplary Embodiment

Figure 10:
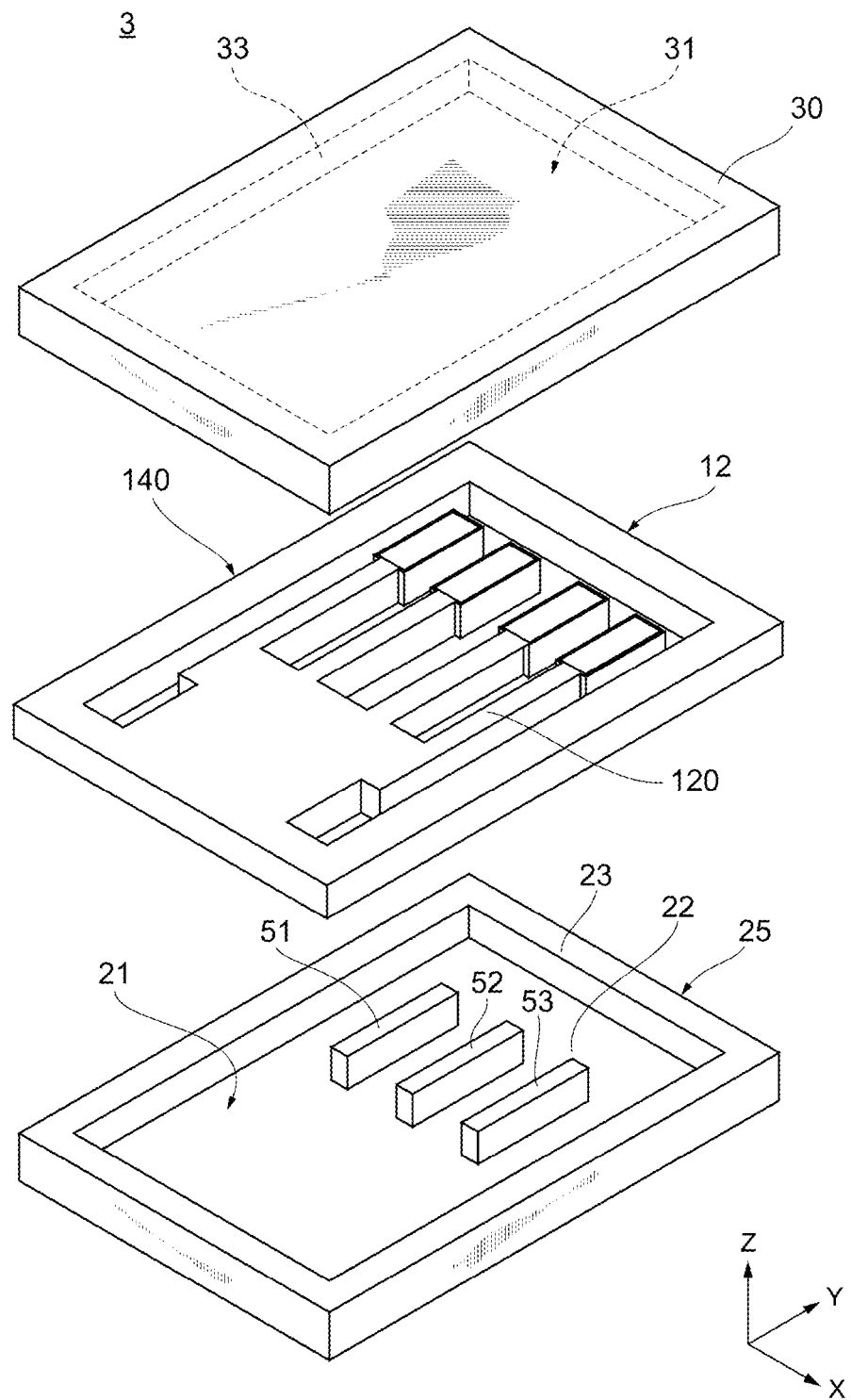
FIG. 10 is an exploded perspective view schematically illustrating the structure of a resonance device according to a third exemplary embodiment.
Figure 11:
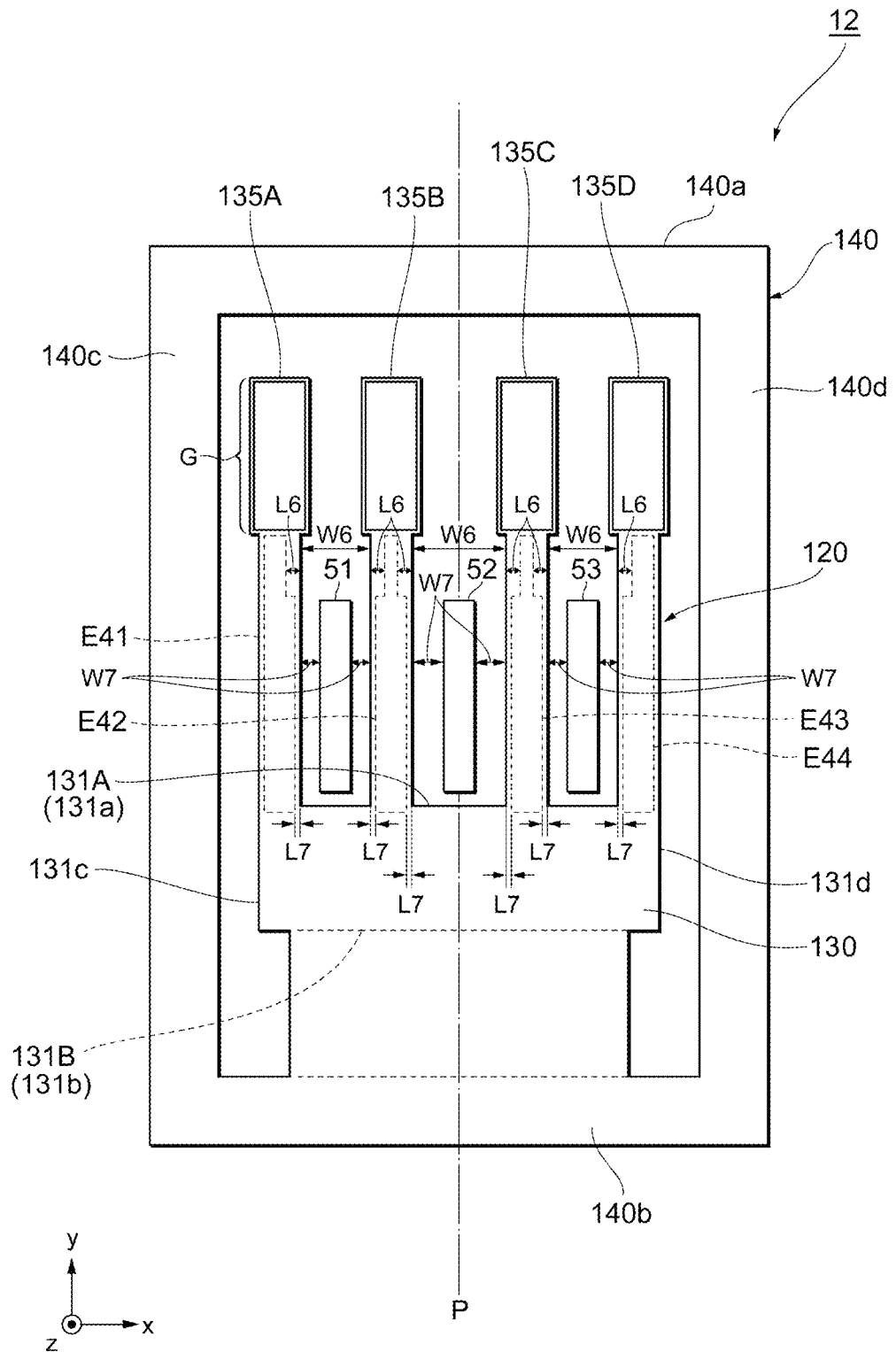
FIG. 11 is a plan view of a resonator according to the third exemplary embodiment.

The configuration and function of a resonance device 3 according to a third embodiment will be described with reference to FIGS. 10 and 11. FIG. 10 corresponds to FIG. 2 and is an exploded perspective view of the resonance device 3 according to the present embodiment. As illustrated in FIG. 10, the resonance device 3 includes a lower cover 25 and a resonator 12 instead of the lower cover 20 and the resonator 10 in the first embodiment. Furthermore, FIG. 11 corresponds to FIG. 4, and is a plan view schematically illustrates a planar structure of the resonator 12 included in the resonance device 3 according to the present embodiment.

Projection portions 51 to 53 projecting in the vibration space are formed on the inner surface of the lower cover 25, that is, on the front surface of the bottom plate 22. The projection portion 51 is formed on the lower cover 25 so as to project between the vibration arm 135A and the vibration arm 135B. The projection portion 52 is formed on the lower cover 25 so as to project between the vibration arm 135B and the vibration arm 135C. The projection portion 53 is formed on the lower cover 25 so as to project between the vibration arm 135C and the vibration arm 135D. In the present embodiment, the projection portions 51 to 53 are each formed in a prism shape extending in parallel to the vibration arms 135A to 135D. The length of each of the projection portions 51 to 53 in the direction along the vibration arms 135A to 135D is approximately 240 μm, and the length (width) orthogonal to the direction is approximately 15 μm. By forming the projection portions 51 to 53 on the lower cover 25, even if the thickness of the lower cover 25 is reduced in order to reduce the thickness of the resonance device 3, for example, it is possible to suppress occurrence of a warp in the lower cover 25.

The resonator 12 has metal layers E41 to 44 instead of the metal layers E21 to E24. The resonator 12 is formed by the projection portions 51 to 53 respectively projecting between the vibration arms 135A to 135D. Accordingly, the release widths of the vibration arm 135A are a release width W7 of the opening groove formed between the vibration arm 135A and the projection portion 51 in a region facing the projection portion 51, and the release width W6 of the opening groove formed between the vibration arm 135A and the vibration arm 135B in a region not facing the projection portion 51. As a result, the release width W6 is larger than the release width W7. For example, the release width W6 is approximately 25 μm, and the release width W7 is approximately 5 μm. The release widths of the vibration arms 135B to 135D are the same as those of the vibration arm 135A, and detailed description thereof will therefore be omitted.

The metal layer E41 is formed in the vibration arm 135A. In the gap width from the edge of the metal layer E41 to the edge of the vibration arm 135A, the gap width L6 in a region not facing the projection portion 51 is set to be larger than a gap width L7 in a region facing the projection portion 51. For example, the gap width L6 is approximately 1.0 μm, and the gap width L7 is approximately 0.5 μm. The other configuration of the metal layer E41 is the same as that of the metal layer E21. It is otherwise noted that the configurations of the metal layers E42 to E44 are the same as that of the metal layer E41, and description thereof will therefore be omitted.

The other configuration of the resonance device 3 is the same as the configuration of the resonance device 1 according to the first embodiment.

Fourth Exemplary Embodiment

Figure 12:
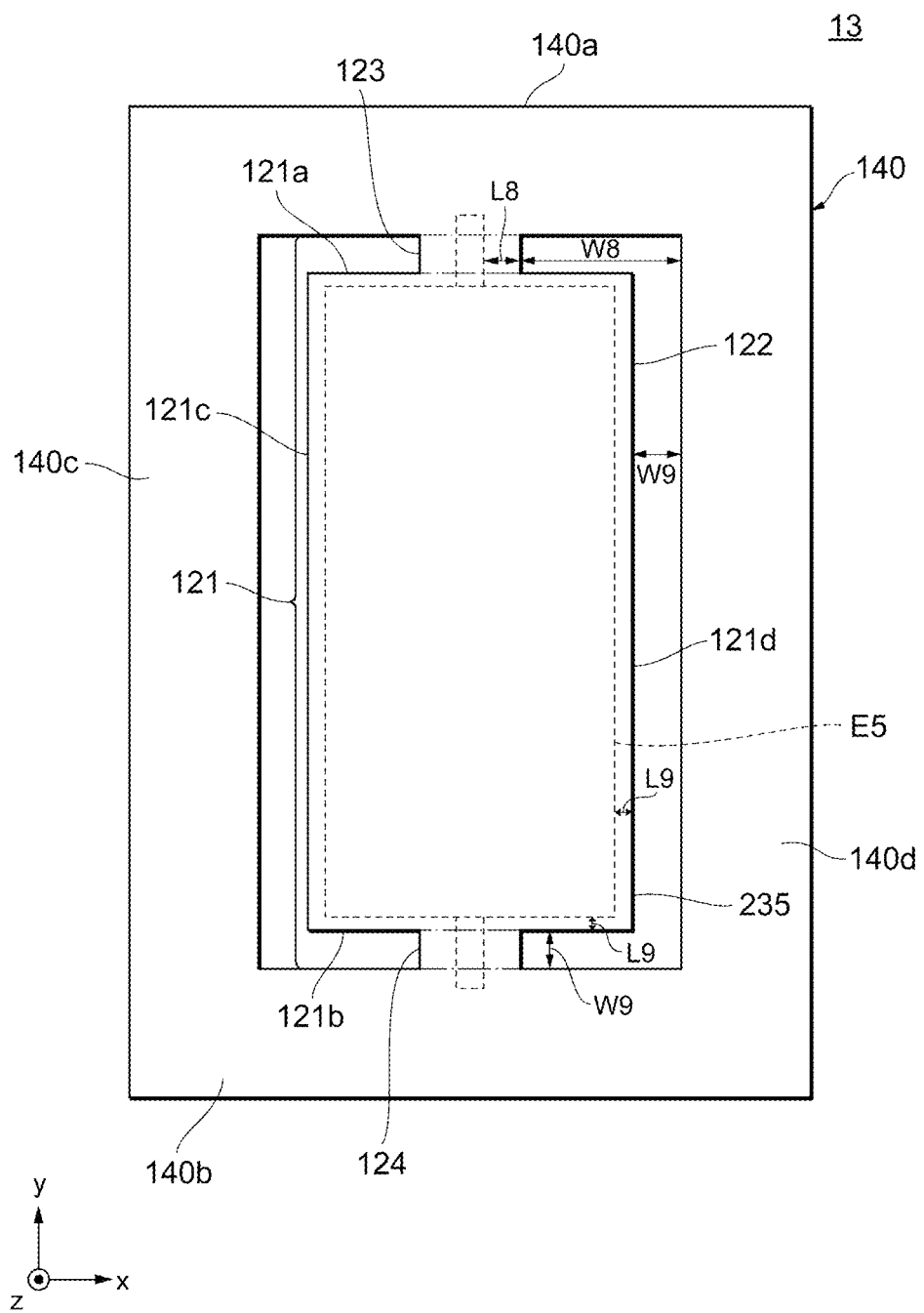
FIG. 12 is a plan view of a resonator according to a fourth exemplary embodiment.

The configuration and function of a resonator 13 according to a fourth embodiment will be described with reference to FIG. 12. FIG. 12 corresponds to FIG. 4 and is a plan view of the resonator 13 according to the present embodiment. The resonator 13 includes a vibration portion 121 and a metal layer E5 instead of the vibration portion 120, the holding arm 110, and the metal layers E21 to E24.

The vibration portion 121 has a first region 122 and second regions 123 and 124. The first region 122 has a contour of a substantially rectangular shape that spreads in a flat plate shape along the XY plane in FIG. 12. Furthermore, the first region 122 has short sides 121a and 121b extending along the X-axis direction, and has long sides 121c and 121d extending along the Y-axis direction. The first region 122 is connected to and held by the holding portion 140 by the second regions 123 and 124 at the short sides 121a and 121b, respectively. Furthermore, the protective film 235 is formed so as to cover the entire surface of the vibration portion 121.

Each of the second regions 123 and 124 has a substantially rectangular shape having a pair of long sides extending along the X-axis direction and a pair of short sides extending along the Y-axis direction. The second regions 123 and 124 have one ends connected to the vicinities of the centers of the short sides 121a and 121b of the first region 122, respectively, and extend from the connected part along the Y-axis direction, that is, substantially perpendicularly to the short sides 121a and 121b. Furthermore, the other ends of the second regions 123 and 124 are connected to the vicinities of the centers of the frame bodies 140a and 140b of the holding portion 140, respectively. It is also noted that the shape of each of the second regions 123 and 124 is not limited to that described above, and may be a substantially rectangular shape having a pair of long sides facing each other in the Y-axis direction. In addition, a circular shape, an elliptical shape, a polygonal shape, or a combination thereof may be employed.

The other configuration of the vibration portion 121 is the same as that of the vibration portion 120 and will not be repeated herein.

The metal layer E5 is formed substantially over the entire surface of the first region 122 of the vibration portion 121. Furthermore, the metal layer E5 is formed from the first region 122 to the second regions 123 and 124, and is extended to the holding portion 140. Note that the metal layer E5 is electrically connected to a terminal (not illustrated) electrically connected to an external power supply, in the holding portion 140.

A release width W9 of an opening groove along the X-axis direction between the first region of the vibration portion 121 and the holding portion 140 (e.g., frame) is set to be smaller than a release width W8 of an opening groove along the X-axis direction between the second regions 123, 124 and the frame bodies 140c, 140d of the holding portion 140. For example, the release width W9 is approximately 10 μm, and the release width W8 is approximately 70 μm. Accordingly, a gap width L8 between the edge of the metal layer E5 of each of the second regions 123 and 124 and the edge of the Si substrate F2 of each of the second regions 123 and 124 is larger than the gap width L9 between the edge of the metal layer E5 of the first region 122 and the edge of the Si substrate F2 of the first region 122. For example, the gap width L9 is approximately 0.5 μm, and the gap width L8 is approximately 1.0 μm.

The other configuration of the resonator 13 is the same as the configuration of the resonator 10 in the first embodiment and will not be repeated herein.

Fifth Exemplary Embodiment

Figure 15:
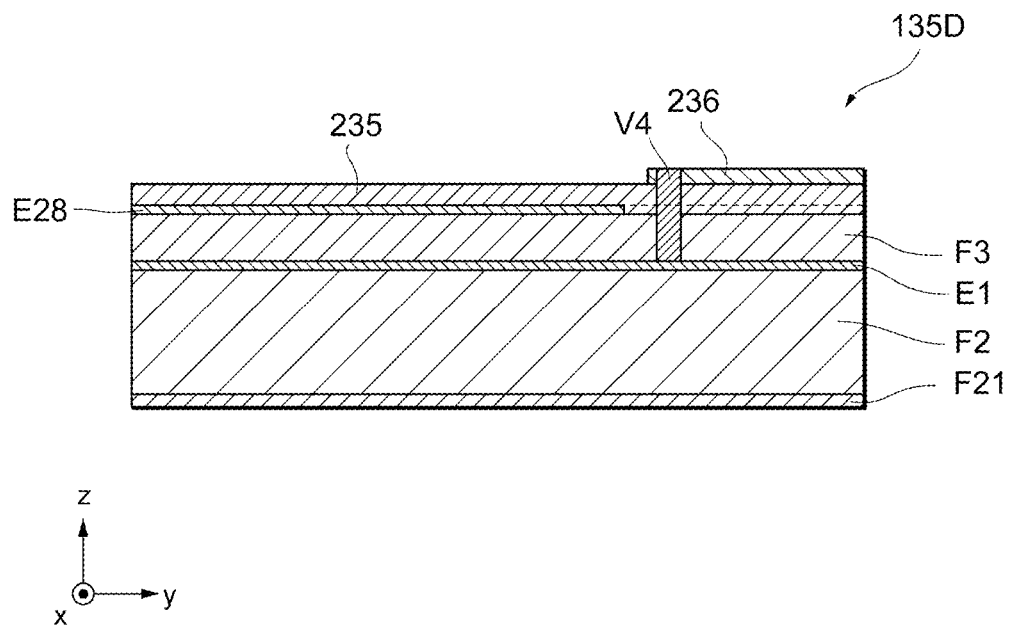
FIG. 15 is a cross-sectional view of the vibration arm, taken along a line FF' in FIG. 13.

The configuration and function of a resonator 14 according to a fifth embodiment will be described focusing on different points from the first embodiment with reference to FIG. 13, FIG. 14, and FIG. 15.

Figure 13:
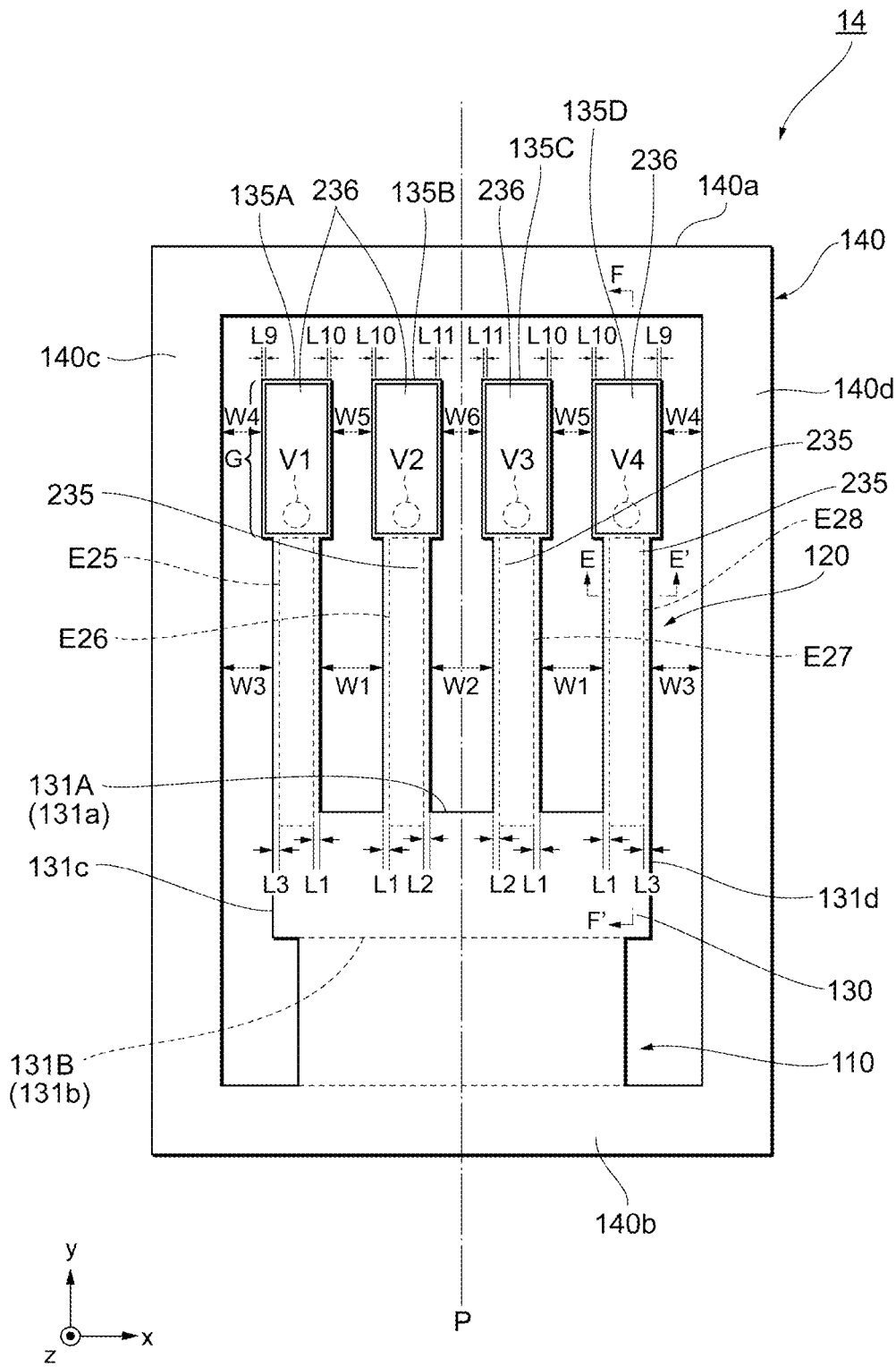
FIG. 13 is a plan view of a resonator according to a fifth exemplary embodiment.

FIG. 13 is a plan view of the resonator 14 according to the present embodiment. In the vibration arms 135A to 135D of the resonator 14 according to the present embodiment, upper electrodes E25 to E28 are formed, respectively. The upper electrodes E25 to E28 are formed from the vicinities of the connecting portions of the plurality of vibration arms 135 and the base portion 130 to the vicinities of the rear ends (i.e., the end portions on the base portion 130 side) of the weight portions G. Furthermore, a plurality of vias V1 to V4 is formed in regions of the weight portions G on the rear end sides, respectively. The other planar structure of the resonator 14 is the same as that of the resonator 10.

It is noted that in the following description, a release width between the weight portion G of each of the vibration arms 135A and 135D in the outer side portion and the holding portion 140 is referred to as W4, a release width between the weight portion G of the vibration arm 135B (135C) in the inner side portion and the weight portion G of the vibration arm 135A (135D) in the outer side portion that are adjacent to each other is referred to as W5, and a release width between the respective weight portions G of the vibration arms 135B and 135C in the inner side portion is referred to as W6.

In addition, as for the gap width of the conductive film 236, a gap width in a region facing the release width W4 (that is, a region, on the side facing the holding portion 140, of the conductive film 236 formed on the weight portion G of each of the vibration arms 135A and 135D in the outer side portion) is referred to as L9, a gap width in a region facing the release width W5 (that is, regions, on the sides facing the vibration arms 135B and 135C in the inner side portion, of the conductive films 236 formed on the respective weight portions G of the vibration arms 135A and 135D in the outer side portion, and regions, on the sides facing the vibration arms 135A and 135D in the outer side portion, of the conductive films 236 formed on the respective weight portions G of the vibration arms 135B and 135C in the inner side portion) is referred to as L10, and a gap width in a region facing the release width W6 (that is, a region on the side where the conductive films 236 formed on the respective weight portions G of the vibration arms 135B and 135C in the inner side portion face each other) is referred to as L11.

The release widths W4, W5, and W6 are preferably, for example, in the following relationship:

W4, W5, W6<W1, W2, W3 (the release width of the weight portion is narrower)

In other words, at least one of the release widths W4, W5, and W6 is smaller than at least one of the release widths W1, W2, and W3. In this case, all of the release widths W4, W5, and W6 may be smaller than all of the release widths W1, W2, and W3. Furthermore, when focusing on one vibration arm, in the vibration arm 135D, for example, the release width W4 may be smaller than the release width W3, and the release width W5 may be smaller than the release width W1. The same may apply to the other vibration arms 135A to 135C in this point. Note that in the present embodiment, the release width W3 is set to be smaller than the release width W1, and the release width W1 is set to be equal to the release width W2 (W1=W2>W3).

At this time, the gap widths L9, L10, and L11 are set so as to satisfy the following relationship:

L9, L10, L11<L1, L2, L3

In other words, at least one of the gap widths L9, L10, and L11 is smaller than at least one of the gap widths L1, L2, and L3. In this case, all of the gap widths L9, L10, and L11 may be smaller than all of the gap widths L1, L2, and L3. Furthermore, when focusing on one vibration arm, in the vibration arm 135D, for example, the gap width L9 may be smaller than the gap width L3, and the gap width L10 may be smaller than the gap width L1. The same may apply to the other vibration arms 135A to 135C in this point.

However, in the case of miniaturization in the width direction (X direction), it is desirable to satisfy W4=W5=W6.

Note that in the case of W4=W5=W6, it is desirable to satisfy L9=L10=L11<L1, L2, L3. In other words, all of the gap widths L9, L10, and L11 are desirably set to be smaller than at least one of the gap widths L1, L2, and L3, and are desirably set to be smaller than all of the gap widths L1, L2, and L3.

Next, the structure of each of the plurality of vibration arms 135 will be described by taking the vibration arm 135 as an example. FIG. 14 is a schematic view illustrating a cross section of the vibration arm 135D, taken along a line EE' in FIG. 13, and FIG. 15 is a schematic diagram illustrating a cross section of the vibration arm 135D, taken along a line FF' in FIG. 13. Note that the via V4 is not included in FIG. 14 as a configuration of a cross section, but is indicated by a broken line for description. As illustrated in FIG. 14 and FIG. 15, in the resonator 14, the via V4 in the vibration arm 135D is formed by filling a hole, which is formed by removing the piezoelectric thin film F3, the metal layer (upper electrode) E28, and the protective film 235 such that the metal layer E1 is exposed, with a metal material. In the vibration arm 135D according to the present embodiment, the conductive film 236 and the metal layer (lower electrode) E1 are electrically connected by the via V4.

Furthermore, as illustrated in FIG. 14, the gap widths L1 and L3 of the upper electrode E28 formed in the section other than the weight portion G are set to be wider than the gap widths L9 and L10 of the conductive film 236 formed on the weight portion G. Specifically, the gap widths are set so as to satisfy L9=L10<L3<L1. The conductive film 236 has an effect of dissipating electric charge by being electrically connected to the lower electrode E1. This effect is enhanced when the film formation area of the conductive film 236 is larger. On the other hand, in the case where the conductive film 236 is formed to the end portion, a risk of short circuiting with an electrode having a different potential occurs. In the resonator 14 according to the present embodiment, the gap widths L9 and L10 of the conductive film 236 formed at the weight portion G are set in accordance with the sizes of the release widths W4 and W5 that the end portions of the conductive film 236 face, and are set to be smaller than the gap widths L1 and L3 of the upper electrode E28 formed in the vicinity of the weight portion G, thereby making it possible to sufficiently obtain the effect of dissipating the electric charge while reducing the risk of the short circuit between the conductive film 236 of the weight portion G and the upper electrode E28 in the vicinity of the weight portion G.

It is noted that the configurations of the vibration arms 135A to 135C in the resonator 14 are the same as that of the vibration arm 135D, and description thereof will therefore be omitted.

In general, the exemplary embodiments of the present invention have been described above. In an exemplary aspect, a resonator 10 is provided that includes a vibration portion 120 that has a substrate F2 having a main surface, a lower electrode E1 formed on the main surface of the substrate F2, a piezoelectric film F3 formed on the lower electrode E1, and an upper electrode E2 formed on the piezoelectric film F3; a holding portion or frame 140 that is provided so as to surround at least part of the vibration portion 120; and a holding arm 110 that connects the vibration portion 120 and the holding portion 140 to each other, in which opening grooves having different widths in a first direction in a plan view of the main surface of the substrate F2 are provided in a periphery of the vibration portion 120, in a plan view of the main surface of the substrate F2, the upper electrode E2 is provided so as to be spaced from an outer edge of the substrate F2 by a gap which is along the first direction, and is formed such that a length of the gap in a region where a width of the opening groove is large becomes larger than a length of the gap in a region where a width of the opening groove is small. According to this aspect, insulation resistance between the upper electrode E2 and the lower electrode E1 is improved, and it is possible to prevent short-circuiting.

Furthermore, the vibration portion 120 may include an insulating film 235 provided so as to cover the upper electrode E2. According to this aspect, the insulation resistance between the upper electrode E2 and the lower electrode E1 is further improved, and it is possible to further prevent short-circuiting.

Furthermore, the vibration portion 120 may include a conductive film 236 that covers at least part of the insulating film 235, and in a plan view of the main surface of the substrate F2, the conductive film 236 may be provided so as to be spaced from the outer edge of the substrate F2 by a gap which is along the first direction, and formed such that the length of the gap of the upper electrode E2 in the region where the width of the opening groove is large becomes larger than a length of the gap of the conductive film 236 in the region where the width of the opening groove is small. At this time, the length of the gap of the upper electrode E2 in the region where the width of the opening groove is large may be formed so as to become larger than the length of the gap of the conductive film 236 in the region where the width of the opening groove is large, and the length of the gap of the upper electrode E2 in the region where the width of the opening groove is small may be formed so as to become larger than the length of the gap of the conductive film 236 in the region where the width of the opening groove is small. According to this aspect, it is possible to prevent short-circuiting between the conductive film 236 and the upper electrode E2.

Furthermore, the vibration portion 120 may include a base portion 130, and a plurality of vibration arms 135 each of which has a fixed end connected to the base portion 130 and an open end provided away from the base portion 130 and extends from the fixed end to the open end. At this time, the number of the plurality of vibration arms 135 may be an even number equal to or greater than four, the region where the width of the opening groove is large may be a region between two vibration arms 135B and 135C arranged in an innermost side portion among the plurality of vibration arms 135, and the region where the width of the opening groove is small may be a region between any two adjacent vibration arms other than the two vibration arms 135B and 135C arranged in the innermost side portion. According to this aspect, since a release width between the vibration arms in the inner side portion is set to be larger than a release width of the vibration arms in the outer side portion, it is possible to improve vibration characteristics.

Furthermore, in a plan view of the main surface of the substrate F2, the plurality of vibration arms 135 may each have a tapered shape in which a width in a direction orthogonal to a direction in which the plurality of vibration arms 135 extends toward the open end increases, the region where the width of the opening groove is large may be a region on a side closer to the fixed ends of two adjacent vibration arms among the plurality of vibration arms 135, and the region where the width of the opening groove is small may be a region on a side closer to the open ends of the two adjacent vibration arms. According to this aspect, since the release width on the fixed end side is set to be wider than that on the open end side of the vibration arm 135, a coupling coefficient can be increased, and as a result, oscillation characteristics can be improved. Furthermore, since the vibration arm has the shape in which the width thereof increases toward the open end side, the weight of the vibration arm on the open end side becomes heavier than that of the fixed end side. This makes it possible to shorten the length of the vibration arm in the extending direction while maintaining a desired frequency, and thus it is possible to achieve miniaturization of the resonator 10.

Furthermore, a resonance device 3 according to one embodiment of the present invention includes: the resonator 10 according to any one of those described above; an upper cover 30 that is provided so as to face the main surface of the resonator 10; and a lower cover 25 that is provided so as to face the main surface of the resonator 10 and has a projection portion projecting between two adjacent vibration arms 135 among the plurality of vibration arms 135, in which the region where the width of the opening groove is small is a region between any one vibration arm of two adjacent vibration arms among the plurality of vibration arms 135 and the projection portion. According to this aspect, by forming the projection portion on the lower cover 25, even if the thickness of the lower cover 25 is reduced in order to reduce the thickness of the resonance device 3, for example, it is possible to suppress occurrence of a warp in the lower cover 25.

Furthermore, in a resonator 12 according to an embodiment of the present invention, the holding portion 140 is provided so as to surround a periphery of a vibration portion 121, the vibration portion 121 has a first region 122 for performing contour vibration and second regions 123 and 124 for connecting the first region 122 to the holding portion 140, the region where the width of the opening groove is large is a region between each of the second regions 123 and 124 and the holding portion 140, and the region where the width of the opening groove is small is a region between the first region 122 and the holding portion 140. According to this aspect, it is possible to prevent short-circuiting between the upper electrode E2 and the lower electrode E1 while maintaining capacitance.

Each exemplary embodiment described above is to facilitate understanding of the present invention, and is not intended to limit the interpretation on the present invention. It is noted that the exemplary embodiments of the present invention can be modified/improved without departing from the essential spirit thereof, and the equivalents are also included in the present invention. In other words, each embodiment to which design changes are added as desired by those skilled in the art also falls within the scope of the present invention as long as the features of the present invention are provided. For example, the elements provided in each embodiment, and the arrangements, materials, conditions, shapes, sizes, and the like thereof, are not limited to the examples given here, and can be changed as desired. Moreover, it goes without saying that the above embodiments are merely examples, and that configurations described in different embodiments can partly replace each other or be combined as well, and such configurations are also included in the scope of the present invention as long as they have the features of the present invention.

REFERENCE SIGNS LIST

1 TO 3 RESONANCE DEVICE
10 TO 12 RESONATOR
30 UPPER COVER
20, 25 LOWER COVER
140 HOLDING PORTION
140a TO d FRAME BODY
110 HOLDING ARM
120, 121 VIBRATION PORTION
130 BASE PORTION
135A TO D VIBRATION ARM
F2 Si SUBSTRATE
F21 SILICON OXIDE LAYER (TEMPERATURE CHARACTERISTICS CORRECTION LAYER)
235 PROTECTIVE FILM
236 CONDUCTIVE FILM

The invention claimed is:

1. A resonator comprising:
a vibration portion that has a substrate with a main surface, a lower electrode disposed on the main surface of the substrate, a piezoelectric film disposed on the lower electrode, and an upper electrode disposed on the piezoelectric film; and
a frame that surrounds at least part of the vibration portion,
wherein a plurality of opening grooves is disposed in a periphery of the vibration portion and have different widths in a first direction in a plan view of the main surface of the substrate, and
wherein, in the plan view of the main surface, the upper electrode is spaced from an outer edge of the substrate by a gap extending along the first direction, and a length of the gap in a region where an opening groove of the plurality of opening grooves has a first width in the first direction is larger than a length of the gap in a region where the opening groove of the plurality of opening grooves has a second width in the first direction that is smaller than the first width.

2. The resonator according to claim 1, wherein the vibration portion includes an insulating film that covers the upper electrode.

3. The resonator according to claim 2,
wherein the vibration portion includes a conductive film that covers at least part of the insulating film, and
wherein, in the plan view of the main surface of the substrate, the conductive film is spaced from the outer edge of the substrate by a gap extending along the first direction, and the length of the gap of the upper electrode in the region where the opening groove has the first width is larger than a length of the gap of the conductive film in the region where the opening groove has the second width that is smaller than the first width.

4. The resonator according to claim 3, wherein the length of the gap of the upper electrode in the region where the opening groove has the first width is larger than the length of the gap of the conductive film in the region where the opening groove has the first width.

5. The resonator according to claim 4, wherein the length of the gap of the upper electrode in the region where the opening groove has the second width is larger than the length of the gap of the conductive film in the region where the opening groove has the second width.

6. The resonator according to claim 1, wherein the vibration portion includes a base, and a plurality of vibration arms each having a fixed end connected to the base and an open end extending away from the base.

7. The resonator according to claim 6, wherein the plurality of vibration arms comprises at least four vibration arms.

8. The resonator according to claim 7,
wherein the region where the opening groove has the first width is a region between two vibration arms arranged in an innermost side among the plurality of vibration arms, and
wherein the region where the opening groove has the second width is a region between any two adjacent vibration arms other than the two vibration arms arranged in the innermost side.

9. The resonator according to claim 6, wherein, in the plan view of the main surface of the substrate, the plurality of vibration arms each has a tapered shape that increases in width in a direction orthogonal to a direction in which the plurality of vibration arms extends toward the open end.

10. The resonator according to claim 9,
wherein the region where the opening groove has the first width is a region on a side closer to the fixed ends of two adjacent vibration arms among the plurality of vibration arms, and
wherein the region where the opening groove has the second width is a region on a side closer to the open ends of the two adjacent vibration arms.

11. The resonator according to claim 1,
wherein the frame surrounds a periphery of the vibration portion, and
wherein the vibration portion has a first region configured for contour vibration and a second region that connects the first region to the frame.

12. The resonator according to claim 11,
wherein the region where the opening groove has the first width is a region between the second region and the frame, and
wherein the region where the opening groove has the second width is a region between the first region and the frame.

13. The resonator according to claim 8, wherein an inclination at an end portion of the two vibration arms arranged in the innermost side is larger than the inclination at an end portion on an opposite side of each of the two vibration arms.

14. A resonator comprising:
a vibration portion comprising lower and upper electrodes with a piezoelectric film disposed therebetween;
a frame that surrounds at least part of the vibration portion; and a plurality of opening grooves disposed in a periphery of the vibration portion and that have different widths in a first direction in a plan view of the substrate, wherein, in the plan view of the substrate, the upper electrode is spaced from an outer edge of the substrate by a gap extending along the first direction, and wherein the gap is greater in width at a first position where an opening groove of the plurality of opening grooves is greater in width and the gap is less in width at a second position where the opening groove of the plurality of opening grooves is smaller in width.

15. The resonator according to claim 14, wherein the vibration portion includes an insulating film that covers the upper electrode.

16. The resonator according to claim 15,
wherein the vibration portion includes a conductive film that covers at least part of the insulating film, and
wherein, in the plan view of the substrate, the conductive film is spaced from the outer edge of the substrate by a gap extending along the first direction, and the length of the gap of the upper electrode in a region at the first position of the opening groove is larger than a length of the gap of the conductive film in a region at the second position of the opening groove.

17. The resonator according to claim 16, wherein the length of the gap of the upper electrode in the region at the position of the opening groove is larger than the length of the gap of the conductive film in the region at the first position of the opening groove.

18. The resonator according to claim 17, wherein the length of the gap of the upper electrode in the region at the second position of the opening groove is larger than the length of the gap of the conductive film in the region at the second position of the opening groove.

19. The resonator according to claim 14,
wherein the frame surrounds a periphery of the vibration portion, and
wherein the vibration portion has a first region configured for contour vibration and a second region that connects the first region to the frame,
wherein the region at the first position of the opening groove is a region between the second region and the frame, and wherein the region at the second position of the opening groove is a region between the first region and the frame.

20. A resonance device comprising:
a resonator including:
a vibration portion that includes a base, and a plurality of vibration arms each having a fixed end connected to the base and an open end extending away from the base, wherein the vibration portion is formed from a substrate with a main surface, a lower electrode disposed on the main surface of the substrate, a piezoelectric film disposed on the lower electrode, and an upper electrode disposed on the piezoelectric film; and
a frame that surrounds at least part of the vibration portion,
wherein a plurality of opening grooves is disposed in a periphery of the vibration portion and have different widths in a first direction in a plan view of the main surface of the substrate, and
wherein, in the plan view of the main surface, the upper electrode is spaced from an outer edge of the substrate by a gap extending along the first direction, and a length of the gap in a region where an opening groove of the plurality of opening grooves has a first width in the first direction is larger than a length of the gap in a region where the opening groove of the plurality of opening grooves has a second width in the first direction that is smaller than the first width;
an upper cover that faces the main surface of the resonator; and
a lower cover that faces the main surface of the resonator and has a projection portion that projects between two adjacent vibration arms among the plurality of vibration arms,
wherein the region where the opening groove of the plurality of opening grooves has the second width is a region between any one vibration arm of two adjacent vibration arms among the plurality of vibration arms and the projection portion.

* * * * *